(12) United States Patent
Hong et al.

(10) Patent No.: US 9,362,283 B2
(45) Date of Patent: Jun. 7, 2016

(54) GATE STRUCTURES FOR TRANSISTOR DEVICES FOR CMOS APPLICATIONS AND PRODUCTS

(71) Applicant: GLOBALFOUNDRIES Inc., Grand Cayman (KY)

(72) Inventors: Zhendong Hong, San Jose, CA (US); Susie Tzeng, Fremont, CA (US); Amol Joshi, Sunnyvale, CA (US); Ashish Bodke, San Jose, CA (US); Divya Pisharoty, Fremont, CA (US); Usha Raghuram, Saratoga, CA (US); Olov Karlsson, San Jose, CA (US); Kisik Choi, Hopewell Junction, NY (US); Salil Mujumdar, San Jose, CA (US); Paul R. Besser, Sunnyvale, CA (US); Jinping Liu, Ballston Lake, NY (US); Hoon Kim, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/793,005

(22) Filed: Jul. 7, 2015

(65) Prior Publication Data

US 2015/0311206 A1  Oct. 29, 2015

Related U.S. Application Data

(62) Division of application No. 14/017,485, filed on Sep. 4, 2013, now Pat. No. 9,105,497.

(51) Int. Cl.
| | |
|---|---|
| *H01L 27/00* | (2006.01) |
| *H01L 29/00* | (2006.01) |
| *H01L 27/092* | (2006.01) |
| *H01L 21/28* | (2006.01) |

(Continued)

(52) U.S. Cl.
CPC ...... *H01L 27/0922* (2013.01); *H01L 21/28097* (2013.01); *H01L 21/28185* (2013.01); *H01L 21/28194* (2013.01); *H01L 21/823835* (2013.01); *H01L 27/092* (2013.01); *H01L 29/4975* (2013.01); *H01L 29/517* (2013.01); *H01L 29/66545* (2013.01)

(58) Field of Classification Search
CPC ............ H01L 21/28097; H01L 21/28185; H01L 21/28194; H01L 21/823835; H01L 29/4975; H01L 29/66545; H01L 29/517; H01L 27/092; H01L 27/0922; H01L 27/283
See application file for complete search history.

(56) References Cited

U.S. PATENT DOCUMENTS

| | | |
|---|---|---|
| 6,204,103 B1 | 3/2001 | Bai et al. |
| 6,440,867 B1 | 8/2002 | Besser et al. |

(Continued)

*Primary Examiner* — Nikolay Yushin
(74) *Attorney, Agent, or Firm* — Amerson Law Firm, PLLC

(57) ABSTRACT

An integrated circuit product includes an NMOS transistor having a gate structure that includes an NMOS gate insulation layer, a first NMOS metal layer positioned on the NMOS gate insulation layer, an NMOS metal silicide material positioned above the first NMOS metal layer, and a layer of a second metal material positioned above and in contact with the NMOS gate insulation layer, the first NMOS metal layer, and the NMOS metal silicide layer. The PMOS transistor has a gate structure that includes a PMOS gate insulation layer, a first PMOS metal layer positioned on the PMOS gate insulation layer, a PMOS metal silicide material positioned above the first PMOS metal layer, and a layer of the second metal material positioned above and in contact with the PMOS gate insulation layer, the first PMOS metal layer, and the PMOS metal silicide layer.

20 Claims, 17 Drawing Sheets

(51) Int. Cl.
  *H01L 29/51*    (2006.01)
  *H01L 29/66*    (2006.01)
  *H01L 21/8238*  (2006.01)
  *H01L 29/49*    (2006.01)

(56) References Cited

U.S. PATENT DOCUMENTS

| | | |
|---|---|---|
| 6,440,868 B1 | 8/2002 | Besser et al. |
| 6,475,908 B1 | 11/2002 | Lin et al. |
| 6,589,866 B1 | 7/2003 | Besser et al. |
| 6,846,734 B2 | 1/2005 | Amos et al. |
| 6,908,850 B2 | 6/2005 | Doris et al. |
| 7,148,546 B2 | 12/2006 | Visokay et al. |
| 7,179,702 B2 | 2/2007 | Matsuo |
| 7,642,153 B2 | 1/2010 | Pas |
| 7,645,687 B2 | 1/2010 | Chong et al. |
| 7,723,176 B2 | 5/2010 | Hase |
| 8,304,841 B2 | 11/2012 | Xu et al. |
| 8,436,404 B2 | 5/2013 | Bohr et al. |
| 2005/0051845 A1 | 3/2005 | Nakagawa et al. |
| 2005/0070062 A1 | 3/2005 | Visokay et al. |
| 2006/0160290 A1 | 7/2006 | Chong et al. |
| 2006/0208320 A1 | 9/2006 | Tsuchiya et al. |
| 2008/0185637 A1 | 8/2008 | Nagaoka et al. |
| 2011/0156107 A1 | 6/2011 | Bohr et al. |

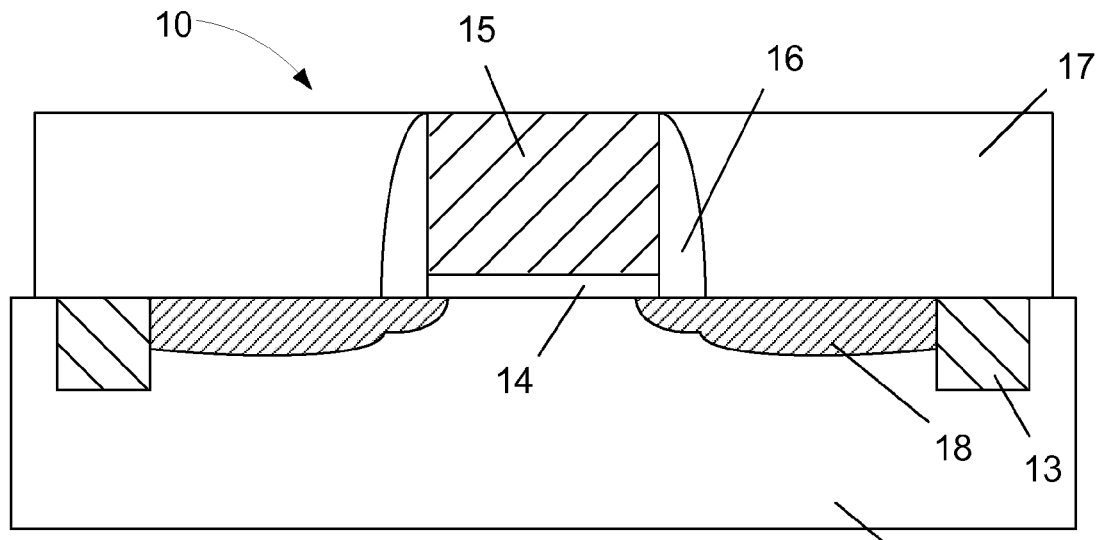
(Prior Art) Figure 1A
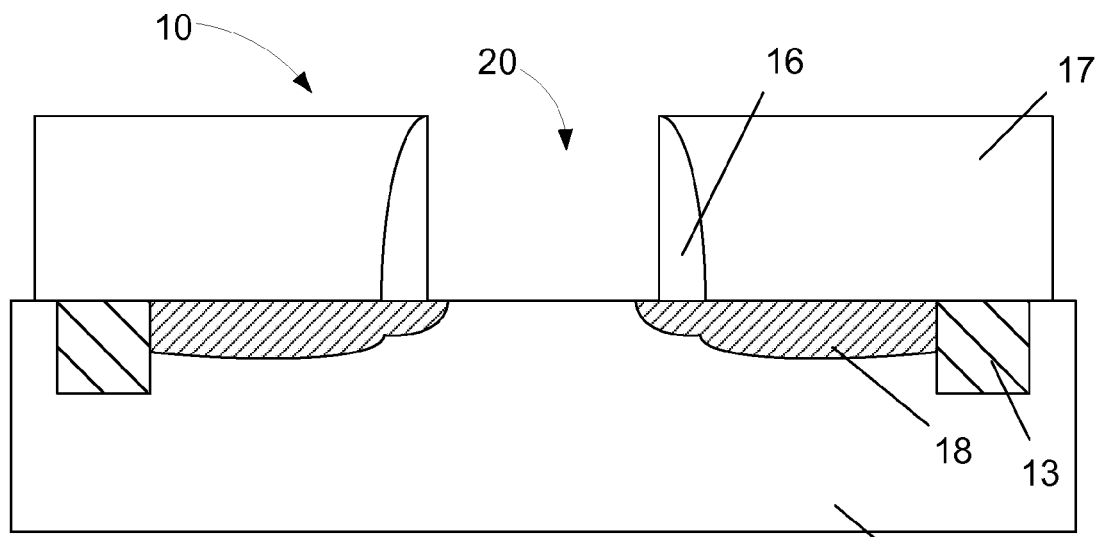
(Prior Art) Figure 1B

GATE STRUCTURES FOR TRANSISTOR DEVICES FOR CMOS APPLICATIONS AND PRODUCTS

CROSS-REFERENCE TO RELATED APPLICATION

This is a divisional of co-pending application Ser. No. 14/017,485, filed Sep. 4, 2013.

BACKGROUND OF THE INVENTION

1. Field of the Invention

Generally, the present disclosure relates to the manufacture of semiconductor devices, and, more specifically, to various novel methods of forming gate structures for transistor devices for CMOS applications and various novel integrated circuit products that contain such transistor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices.

Field effect transistors, whether an NMOS or a PMOS device, typically include a source region, a drain region, a channel region that is positioned between the source region and the drain region, and a gate electrode positioned above the channel region. Current flow through the FET is controlled by controlling the voltage applied to the gate electrode. For an NMOS device, if there is no voltage (or a logically low voltage) applied to the gate electrode, then there is no current flow through the device (ignoring undesirable leakage currents, which are relatively small). However, when an appropriate positive voltage (or logically high voltage) is applied to the gate electrode, the channel region of the NMOS device becomes conductive, and electrical current is permitted to flow between the source region and the drain region through the conductive channel region. For a PMOS device, the control voltages are reversed. Field effect transistors may come in a variety of different physical shapes, e.g., so-called planar FET devices or so-called 3D or FinFET devices.

For many decades, planar FET devices were the dominant choice for making integrated circuit products due to the relatively easier manufacturing methods that are used to form such planar devices as compared to the manufacturing methods involved in forming 3D devices. To improve the operating speed of planar FETs, and to increase the density of planar FETs on an integrated circuit device, device designers have greatly reduced the physical size of planar FETs over the years. More specifically, the channel length of planar FETs has been significantly decreased, which has resulted in improving the switching speed of planar FETs. However, decreasing the channel length of a planar FET also decreases the distance between the source region and the drain region. In some cases, this decrease in the separation between the source and the drain regions makes it difficult to efficiently inhibit the electrical potential of the source region and the channel from being adversely affected by the electrical potential of the drain region. This is sometimes referred to as so-called short channel effects, wherein the characteristic of the planar FET as an active switch is degraded.

As noted above, in contrast to a planar FET, a so-called 3D or FinFET device has a three-dimensional (3D) structure. More specifically, in a FinFET, a generally vertically positioned fin-shaped active area is formed in a semiconductor substrate and a gate structure (gate insulation layer plus the gate electrode) is positioned around both of the sides and the upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin, become a conductive channel region, thereby allowing current to flow. In a FinFET device, the "channel-width" is approximately two times (2x) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements has been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1A-1D simplistically depict one illustrative prior art method for forming an HK/MG replacement gate structure using a replacement gate technique. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1C, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm that serves as a barrier layer to protect the high-k gate insulation layer 30A from reacting with the work function metal for the device), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm that serves to protect the second metal layer 30C from oxidation and it also may function as an adhesion and nucleation layer for the later bulk deposition of tungsten or aluminum materials) and a bulk metal layer 30E, such as aluminum or tungsten. Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

As the gate length of transistor devices has decreased, the physical size of the gate cavity 20 has also decreased. Thus, it is becoming physically difficult to fit all of the needed layers of material needed for the replacement gate structure 30, particularly for NMOS devices due to the greater number of layers of material that are typically used to form the gate structures for the NMOS devices, within the reduced-size gate cavity. For example, as gate lengths continue to decrease, voids or seams may be formed as the various layers of material are deposited into the gate cavity 20. Such voids or seams may result in devices that perform at levels less than anticipated or, in some cases, the formation of devices that are simply not acceptable and have to be discarded.

The term "work function" (WF) is commonly used in the art of semiconductor design and manufacturing to refer to the minimum energy needed to remove an electron from the surface of metal. The work function of a metal is typically a constant characteristic of that metal material and it is usually measured in electron-volts (eV). In general, in CMOS integration schemes using a silicon substrate, a work function metal having a work function near the conduction band edge of silicon (about 4.0 eV) is necessary for NMOS type devices, while a different work function metal having a work function near the valance band edge of silicon (about 5.1-5.2 eV) is necessary for PMOS devices. Thus, in CMOS integration schemes employing high-k gate dielectric materials, at least two types of gate stacks are needed, i.e., a stack of suitable materials that satisfies the individual work function requirements for the PMOS devices and a different stack of materials that satisfies the individual work function requirements for the NMOS devices. As noted above, the gate stack for the PMOS devices provides an effective work function closer to the valence band edge of the material of the channel of the PMOS devices, and the gate stack for the NMOS devices provides an effective work function closer to the conduction band edge of the material of the channel of the NMOS devices. Forming such different layer stacks for different devices is time consuming and involves many complex process operations.

The present disclosure is directed to various novel methods of forming gate structures for transistor devices for CMOS applications and various novel integrated circuit products that contain such transistor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming gate structures for transistor devices for CMOS applications and various novel integrated circuit products that contain such transistor devices. One illustrative integrated circuit product disclosed herein includes, among other things, an NMOS transistor that includes an NMOS gate structure, a first dielectric cap layer positioned above the NMOS gate structure, and a first sidewall spacer positioned adjacent to and laterally confining sidewalls of the NMOS gate structure and sidewalls of the first dielectric gate cap layer. The NMOS gate structure is comprised of an NMOS gate insulation layer comprised of a high-k gate insulation material, a first NMOS metal layer comprised of a first metal positioned on the NMOS gate insulation layer and a NMOS metal silicide material positioned above the first NMOS metal layer, wherein the NMOS metal silicide material comprises a first amount of atomic silicon. In this embodiment, the product also includes a PMOS transistor that includes a PMOS gate structure, a second dielectric cap layer positioned above the PMOS gate structure, and a second sidewall spacer positioned adjacent to and laterally confining sidewalls of the PMOS gate structure and sidewalls of the second dielectric gate cap layer. The PMOS gate structure is comprised of a PMOS gate insulation layer comprised of the high-k gate insulation material, a first PMOS metal layer comprised of the first metal positioned on the PMOS gate insulation layer, and a PMOS metal silicide material positioned above the first PMOS metal layer, wherein the PMOS metal silicide material comprises a second amount of atomic silicon, and wherein the first and second amounts of atomic silicon are different.

Another illustrative integrated circuit product includes, among other things, an NMOS transistor having a gate structure comprised of an NMOS gate insulation layer comprised of a high-k gate insulation material, a first NMOS metal layer comprised of a first metal positioned on the NMOS gate insulation layer, and a NMOS metal silicide material positioned above the first NMOS metal layer, wherein the NMOS metal silicide material comprises 50-95% atomic silicon. Additionally, a layer of a second metal material is positioned above and in contact with each of the NMOS gate insulation layer, the first NMOS metal layer, and the NMOS metal silicide layer. In this embodiment, the integrated circuit product also includes a PMOS transistor having a gate structure comprised of a PMOS gate insulation layer comprised of the high-k gate insulation material, a first PMOS metal layer comprised of the first metal positioned on the PMOS gate insulation layer and a PMOS metal silicide material positioned above the first PMOS metal layer, wherein the PMOS metal silicide material comprises 2-40% atomic silicon. Furthermore, a layer of the second metal material is positioned above and in contact with each of the PMOS gate insulation layer, the first PMOS metal layer, and the PMOS metal silicide layer.

In yet a further illustrative embodiment, an integrated circuit product includes an NMOS transistor and a PMOS transistor, wherein the NMOS transistor includes an NMOS gate structure, a first dielectric cap layer positioned above the NMOS gate structure, and a first sidewall spacer positioned adjacent to and laterally confining sidewalls of the NMOS gate structure and sidewalls of the first dielectric gate cap layer, and the PMOS transistor includes a PMOS gate structure, a second dielectric cap layer positioned above the PMOS gate structure, and a second sidewall spacer positioned adjacent to and laterally confining sidewalls of the PMOS gate structure and sidewalls of the second dielectric gate cap layer. The NMOS gate structure includes, among other things, an NMOS gate insulation layer comprised of a high-k gate insulation material, wherein the NMOS gate insulation layer includes a first horizontal bottom portion positioned above an active region of the NMOS transistor and first vertical sidewall portions that define a portion of a sidewall of the NMOS gate structure. The NMOS gate structure also includes a first NMOS metal layer comprised of a first metal material positioned on the NMOS gate insulation layer and an NMOS metal silicide material positioned above the first NMOS metal layer, wherein the NMOS metal silicide material has a first amount of atomic silicon and the first vertical sidewall portions of the NMOS gate insulation layer laterally confine the first NMOS metal layer and the NMOS metal silicide material. Furthermore, the PMOS gate structure includes a PMOS gate insulation layer comprised of the high-k gate insulation material, wherein the PMOS gate insulation layer includes a second horizontal bottom portion positioned above an active region of the PMOS transistor and second vertical sidewall portions that define a portion of a sidewall of the PMOS gate structure. Additionally, the PMOS gate structure also includes a first PMOS metal layer comprised of the first metal material positioned on the PMOS gate insulation layer, and a PMOS metal silicide material positioned above the first PMOS metal layer, wherein the PMOS metal silicide material has a second amount of atomic silicon that is different from the first amount of atomic silicon and the second vertical sidewall portions of the PMOS gate insulation layer laterally confine the first PMOS metal layer and the PMOS metal silicide material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art method of forming a gate structure of the transistors using a so-called "replacement gate" technique;

Figure 1C:
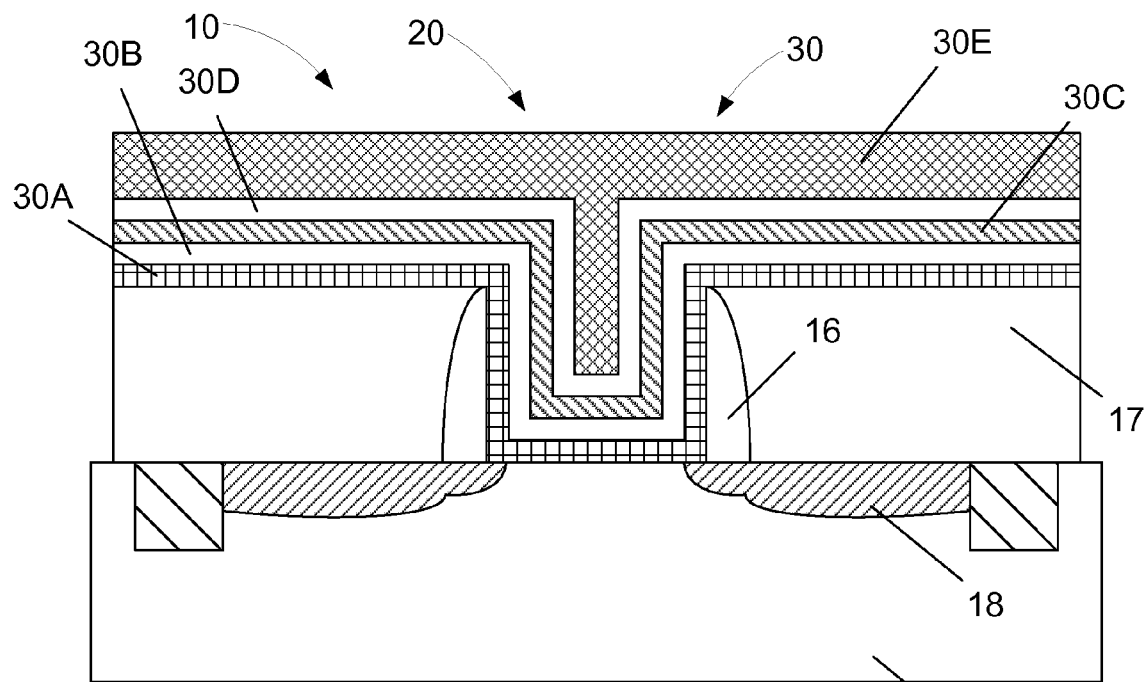
Figure 1D:
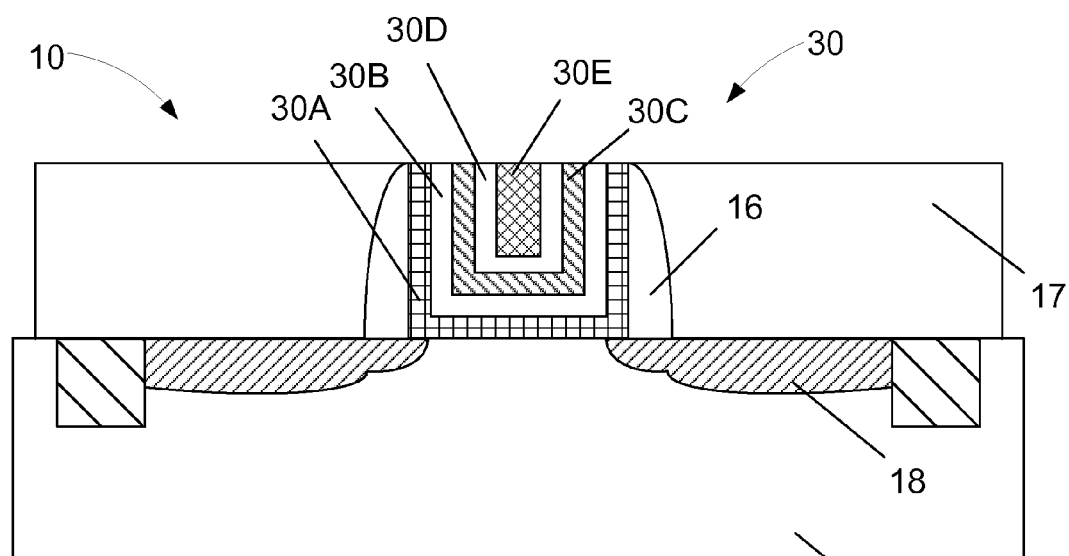

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods of forming gate structures for transistor devices for CMOS applications and various novel integrated circuit products that contain such transistor devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

As will be appreciated by those skilled in the art after a complete reading of the present application, the inventions disclosed herein may be employed in forming integrated circuit products using planar transistor devices, as well as so-called 3D devices, such as FiNFETs, or a combination of such devices. For purposes of disclosure, reference will be made to one illustrative process flow wherein the methods disclosed herein are performed to form an illustrative FinFET device. In other embodiments, the methods disclosed herein may be employed to manufacture integrated circuit products using CMOS technology to form a plurality of FinFET devices. However, the inventions disclosed herein should not be considered to be limited to such illustrative examples. For example, the inventions disclosed herein may be employed in forming a plurality of FinFET transistor devices or planar transistor devices using NMOS, PMOS or CMOS technology.

Figure 2A:
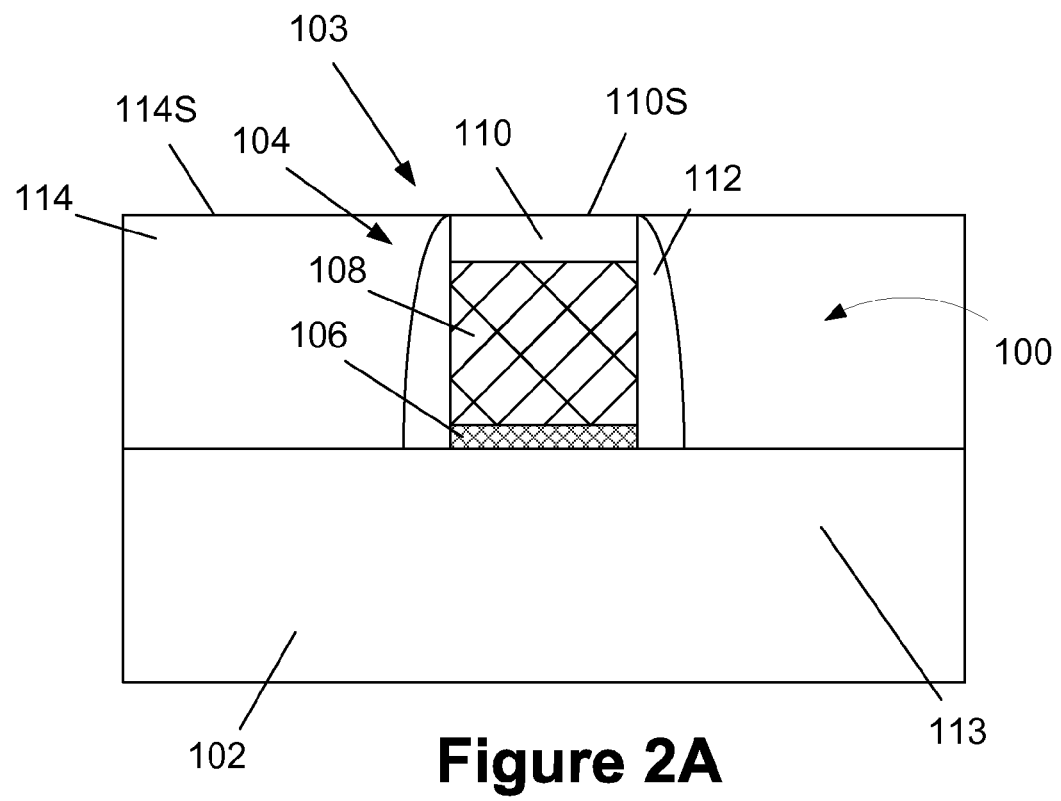
FIGS. 2A-2I depict one illustrative method disclosed herein for forming gate structures for transistor devices and an example of an integrated circuit product that contain such transistor devices.

FIG. 2A is a simplified view of an illustrative integrated circuit product 100 at an early stage of manufacturing. An illustrative transistor 104 will be formed in and above the semiconductor substrate 102. So as not to obscure the inventions disclosed herein, an isolation region that is formed in the substrate 102 to define an active region where the transistor 104 will be formed is not depicted in the attached drawings. The transistor 104 may be either an N-type transistor or a P-type transistor. Additionally, various doped regions, e.g., source/drain regions, halo implant regions, well regions and the like, are also not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. The cross-sectional view depicted in the attached figures is taken through the long axis of an illustrative fin 113 that is formed from the substrate 102. Stated another way, the cross-sectional views depicted in the attached drawings are taken through the gate structures of the various transistors in a direction that corresponds to the gate length direction of the transistors.

In the example disclosed herein, the transistor 104 will be formed using a replacement gate technique. Accordingly, FIG. 2A depicts the product 100 at a point in fabrication wherein a sacrificial gate structure 103 has been formed above the substrate 102. As noted above, at this point in the replacement gate process flow, source/drain regions (not shown) would have already been formed in the substrate 102 and an anneal process would have been performed to activate the implanted dopant materials and repair any damage to the substrate 102 due to the various ion implantation processes that were performed. The sacrificial gate structure 103 includes a sacrificial gate insulation layer 106 and a dummy or sacrificial gate electrode 108. Also depicted are an illustrative sidewall spacer 112 and an illustrative gate cap layer 110. The various components and structures of the product 100 may be formed using a variety of different materials and by performing a variety of known techniques. For example, the sacrificial gate insulation layer 106 may be comprised of silicon dioxide, the sacrificial gate electrode 108 may be comprised of polysilicon, and the sidewall spacer 112 and the gate cap layer 110 may be comprised of silicon nitride. The layers of material depicted in FIG. 2A, as well as the layers of materials described below, may be formed by any of a variety of different known techniques, e.g., a chemical vapor deposition (CVD) process, an atomic layer deposition (ALD) process, a thermal growth process, physical vapor deposition (PVD), or plasma enhanced versions of such processes, etc. Also depicted in FIG. 2A is a layer of insulating material 114, e.g., silicon dioxide, a low-k material (k value less than about 3.3), etc., that was deposited above the product 100. In one embodiment, the layer of insulating material 114 may be a layer of silicon dioxide that is formed by performing a CVD process. The layer of insulating material 114 may be formed to any desired thickness. FIG. 2A depicts the product 100 after a planarization process has been performed on the layer of insulating material 114 such that the upper surface 114S of the layer of insulating material 114 is substantially even with the upper surface 110S of the gate cap layer 110. Importantly, this planarization process exposes the upper surface 110S of the gate cap layer 110 such that it can be removed. In one illustrative embodiment, the planarization process may be a chemical mechanical planarization (CMP) process that stops on the gate cap layer 110, or it may be a timed etch-back process that removes the layer of insulating material 114 selectively relative to the gate cap layer 110.

Figure 2B:
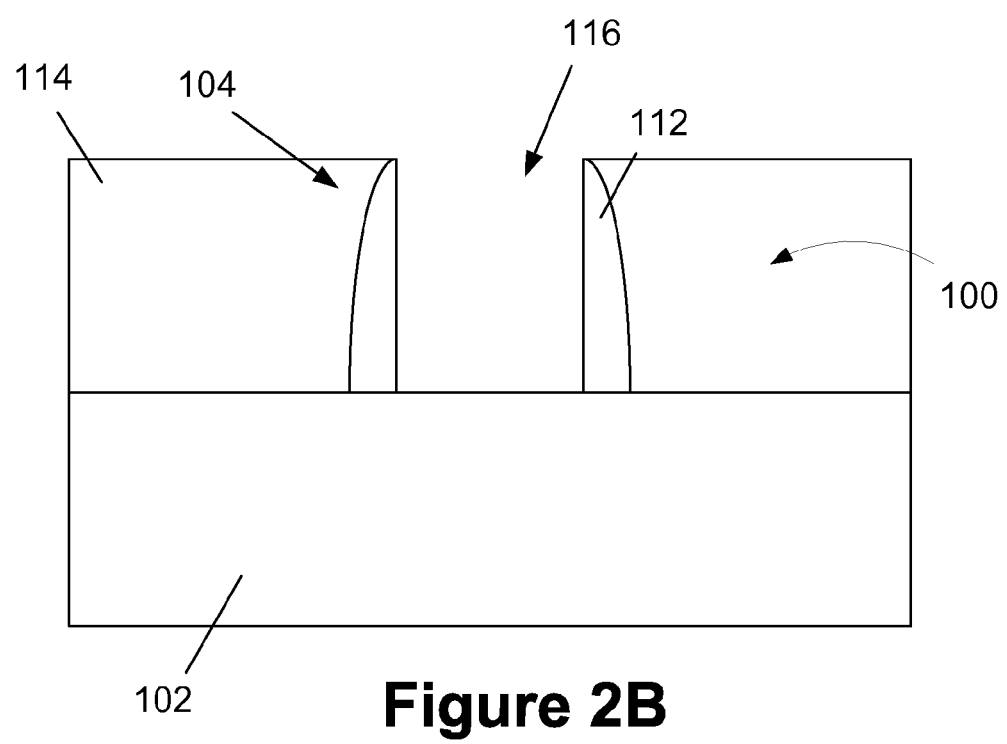

FIG. 2B depicts the product 100 after one or more wet or dry etching processes were performed to remove the gate cap layer 110, the sacrificial gate electrode 108 and the sacrificial gate insulation layer 106 to thereby define a gate cavity 116 where a replacement gate structure will subsequently be formed for the transistor 104. Typically, the sacrificial gate insulation layer 106 is removed as part of the replacement gate technique, as depicted herein. However, the sacrificial gate insulation layer 106 may not be removed in all applications. Even in cases where the sacrificial gate insulation layer 106 is intentionally removed, there will typically be a very thin native oxide layer (not shown) that forms on the substrate 102 within the gate cavity 116.

Figure 2C:
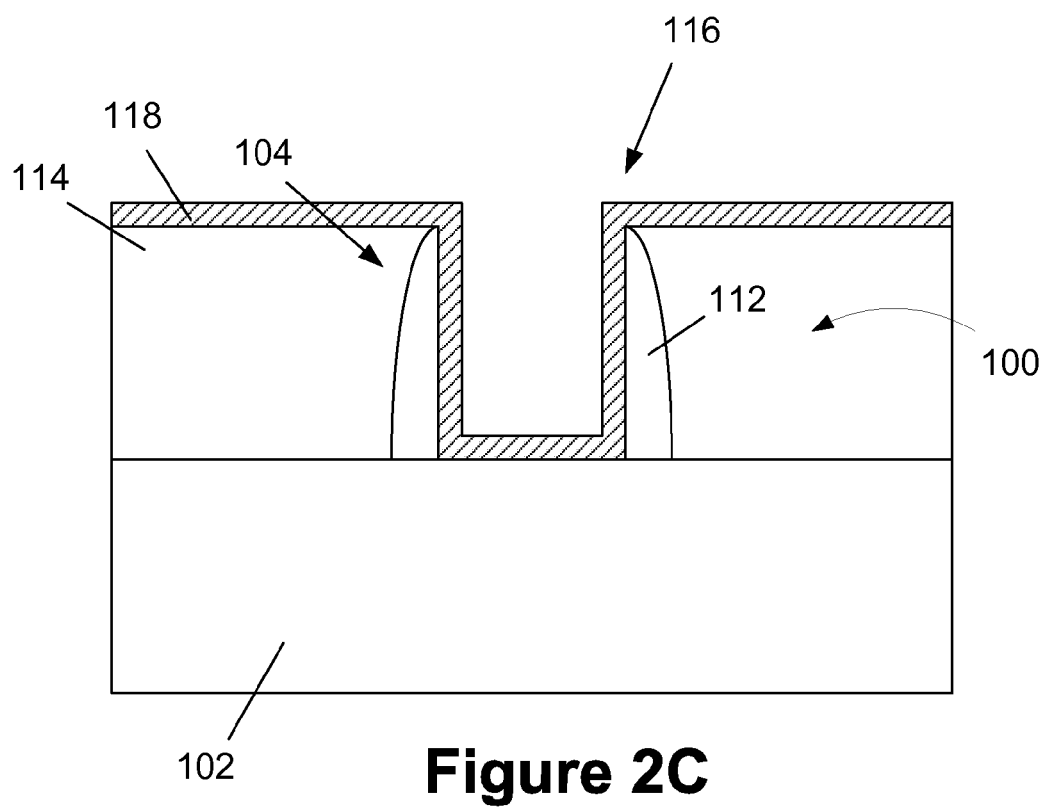

FIG. 2C depicts the product after several process operations were performed. First, a pre-clean process was performed in an attempt to remove all foreign materials from within the gate cavity 116 prior to forming the various layers of material that will become part of the replacement gate structure. Thereafter, a high-k (k value greater than 10) gate insulation layer 118, such as hafnium oxide, having a thickness of approximately 2 nm was initially deposited in the gate cavity 116 by performing an ALD process.

Figure 2D:
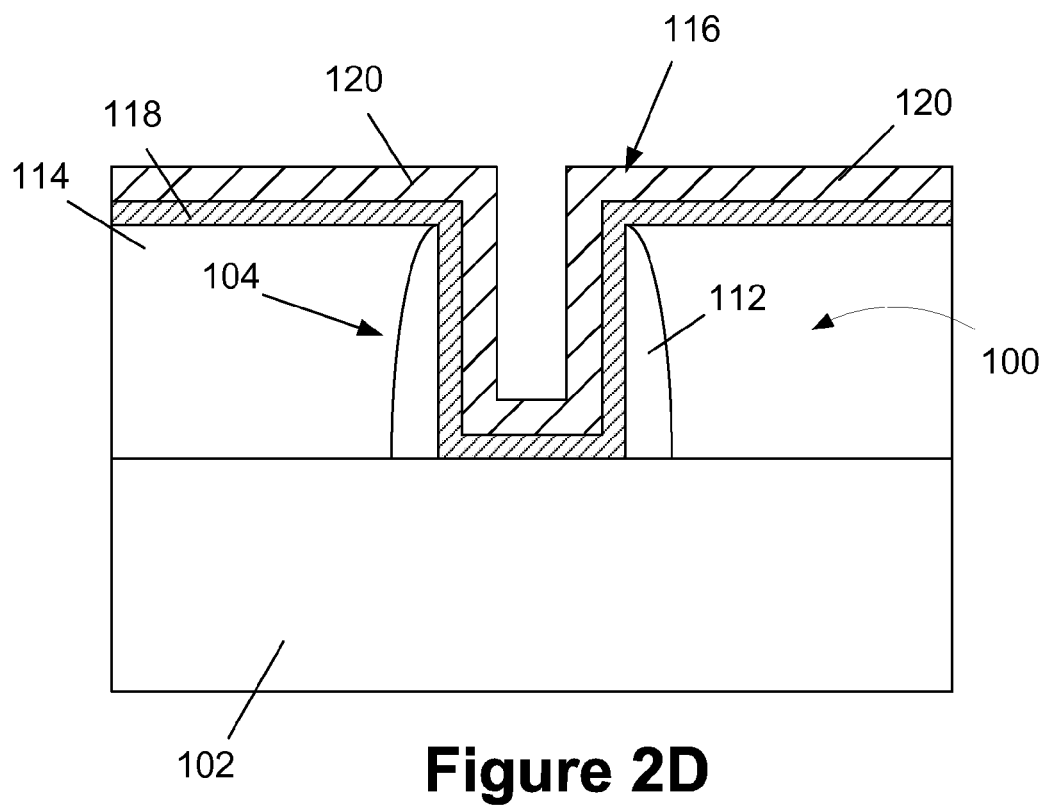

Next, as shown in FIG. 2D, a first metal layer 120 (e.g., a layer of titanium nitride with a thickness of about 1-5 nm) was formed on the high-k gate insulation layer 118 and within the gate cavity 116. The first metal layer 120 is comprised of a metal that may serve as a barrier layer to protect the high-k gate insulation layer 118 during a so-called "reliability anneal" process that will be performed to increase the reliability of the high-k gate insulation layer 118, as described more fully below. In one example, the first metal layer 120 may be formed by performing a plasma-enhanced physical vapor deposition (PVD) process. Next, a silicon-containing material layer (not shown), such as polysilicon or amorphous silicon, is blanket-deposited on the product 100 so as to over-fill the gate cavity 116. The silicon-containing material layer may be formed by performing, for example, a CVD process. After the silicon-containing material layer is formed, an anneal process may be performed to increase the reliability of the high-k gate insulation layer 118. The parameters of such an anneal process are well known to those skilled in the art. The silicon-containing layer may then be removed by performing an etching process. In some cases, the first metal layer 120 may remain in place while, in other applications, but typically, the first metal layer 120 that was used in the reliability anneal of the high-k gate insulation layer 118 will be removed (by selective etching relative to the high-k gate insulation layer 118) and a "new" first metal layer 120 will be formed on the high-k gate insulation layer 118. However, the present application should be understood to cover both situations.

Figure 2E:
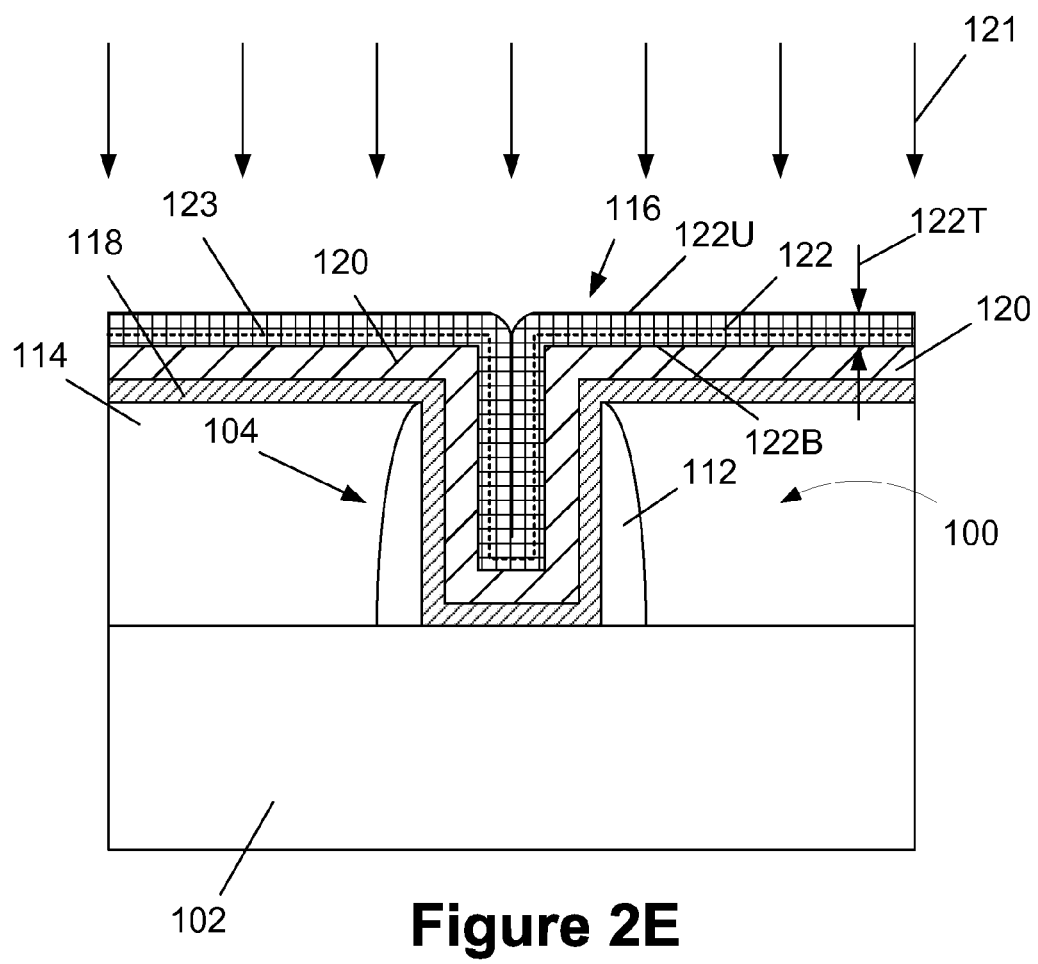

FIG. 2E depicts the product 100 in accordance with one illustrative embodiment disclosed herein where a metal silicide deposition process 121 is performed to directly deposit a metal silicide layer 122 on the product 100 so as to, in one embodiment, substantially over-fill the reaming portions of the gate cavity 116. In the depicted example, the metal silicide layer 122 is deposited on the first metal layer 120. In other applications, another optional metal layer (indicated by the dashed line 123) that may act as an adhesion layer may be formed on the first metal layer 120 prior to forming the metal silicide layer 122. Whether or not such an adhesion layer is employed may vary upon the material selected for the first metal layer 120 and the composition of the metal silicide layer 122. So as not to obscure the presently disclosed inventions, the layer 123 will not be depicted in any subsequent drawings.

In one illustrative embodiment, the metal silicide layer 122 may be formed by performing an ALD, a CVD or a PVD process (or plasma-enhanced versions of such processes), and it may be formed to any desired thickness 122T (as measured above a substantially planar surface). In some applications, the metal silicide layer 122 may be formed in such a manner such that few, if any, voids are present in the gate cavity 116. In other applications, due to the limited width of the gate cavity 116, when the metal silicide layer 122 is deposited, it may tend to "pinch-off" the gate cavity 116, thereby creating a void or seam in the metal silicide layer 122 within the cavity 116. In the case where such a void is formed, the gate metal material that will be subsequently formed (as described more fully below) may fill all or a portion of such a void. For purposes of disclosing the present inventions, the metal silicide layer 122 will be depicted as having been formed in such a manner so as to result in a substantially void-free metal silicide layer 122.

The metal silicide layer 122 may be comprised of any of a variety of metal silicide materials, e.g., tungsten silicide, hafnium silicide, tantalum silicide, titanium silicide, nickel-platinum silicide, cobalt silicide, erbium silicide, molybdenum silicide, lanthanum silicide, yttrium silicide, ytterbium silicide, a silicide of a refractory metal, a silicide of a rare earth metal or a silicide of a transition metal, etc. The metal silicide layer 122 may also be deposited to any desired thickness 122T, e.g., 1-7 nm. In one illustrative embodiment where the metal silicide layer 122 is comprised of tungsten silicide, it may be formed using $WF_6$ or $WCl_6$ and $SiH_4$ or $Si_2H_6$ as precursor gases at flow rates of about 10-5000 sccm and 10-5000 sccm, respectively, at a temperature that falls within the range of about 200-600° C. and at a pressure that falls within the range of about 0.1-100 Torr. Of course, the process conditions can vary based upon, among other things, the design of the process chamber and the desired composition of the metal silicide layer 122.

In the depicted example in FIG. 2E, the metal silicide layer 122 is shown as having the atomic silicon uniformly distributed throughout the thickness 122T of the metal silicide layer 122. In practice, concentration of the atomic silicon within the metal silicide may not be uniform. Moreover, in some applications, the parameters of the deposition process 121 may be intentionally varied such that there is a variation in the amount of atomic silicon throughout the thickness 122T of the metal silicide layer 122. In general, the ratio of metal to silicon can be changed by controlling various process parameters. For example, the deposition process 121 may be controlled such that there is a higher concentration of atomic silicon in the metal silicide layer 122 at the bottom surface 122B of the metal silicide layer 122, i.e., at the interface with the first metal layer 120, than there is at the upper surface 122U of the metal silicide layer 122. One illustrative way to achieve a metal silicide layer 122 with such a variation in atomic silicon is by reducing the amount of silicon-containing precursors used in the deposition process (either continuously or in a step-wise fashion) as the deposition process 121 proceeds. Of course, if desired, the deposition process 121 could be performed in such a manner that there is a higher concentration of atomic silicon in the metal silicide layer 122 at the upper surface 122U of the metal silicide layer 122 than there is at the bottom surface 122B of the metal silicide layer 122.

Figure 3A:
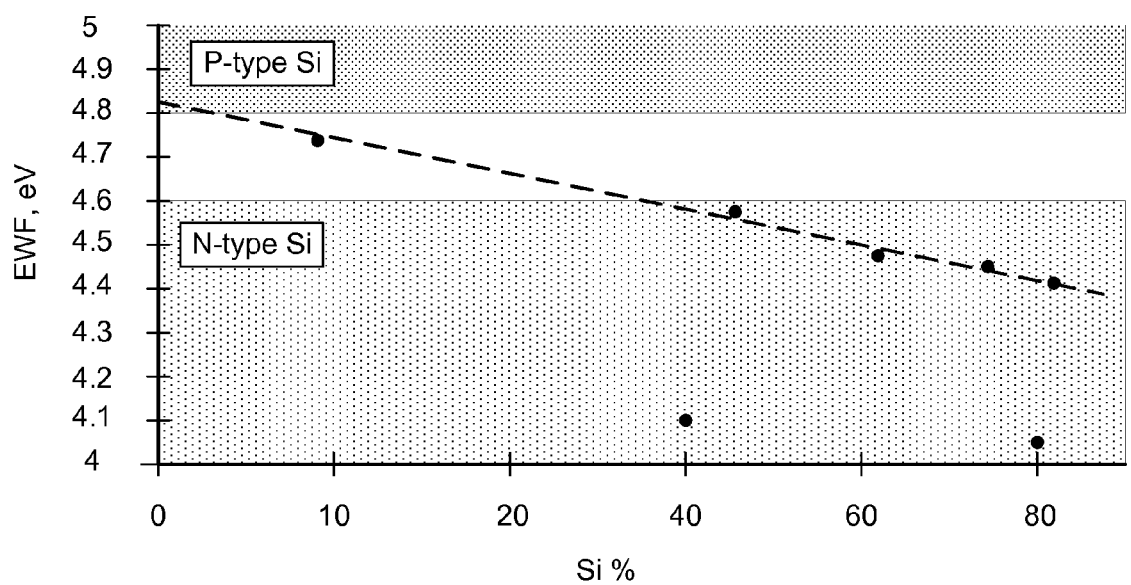
FIGS. 3A-3B depict various aspects of one method disclosed herein wherein a metal silicide layer comprised of tungsten silicide has been formed as part of the process of forming a gate structure for an illustrative transistor device.
Figure 3B:
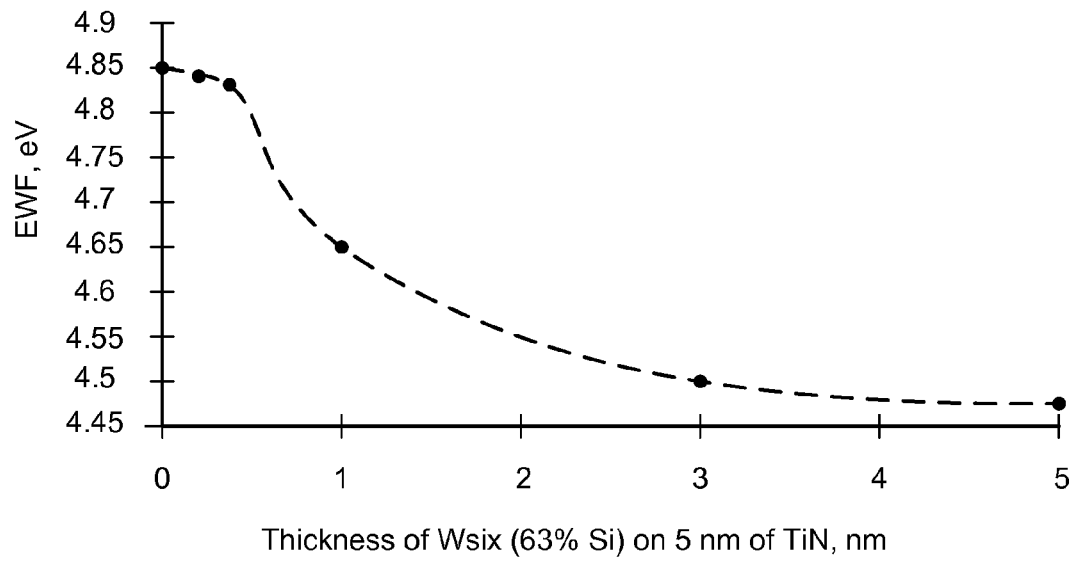

The inventors have discovered that, by varying the amount of atomic silicon in the metal silicide layer 122, the effective work function of the overall stack of the gate metals at the interface between the first metal layer 120 and the high-k gate insulation layer 118 may be controlled or "tuned" to a desired level. FIGS. 3A-3B depict various aspects of the process that may be performed to form the metal silicide layer 122. FIG. 3A is a graph of the effective work function (EWF) of the overall gate stack of materials as a function of the atomic percentage of silicon in an illustrative metal silicide layer 122 comprised of a 5 nm thick tungsten silicide that is deposited on a first metal layer 120 comprised of titanium nitride (TiN) that is about 2 nm in thickness. In the illustrative example where the metal silicide layer 122 is comprised of tungsten silicide, the effective work function of a gate stack that includes such a tungsten silicide layer 122 may be tuned or adjusted to have effective work function values that fall within the range of about 4.4 eV to about 4.8 eV. Typically, work function adjusting metals for use with N-type transistor devices, e.g., TiAlC, normally result in a gate stack that has an effective work function less than about 4.6 eV. On the other hand, work function adjusting metals commonly used for P-type transistor devices typically result in a gate stack having an effective work function greater than about 4.8 eV. Thus, as will be recognized by those skilled in the art after a complete reading of the present application, the methods and structures disclosed herein may be employed to form metal silicide layers 122 that can be individually tailored to be used with N-type or P-type transistor devices.

In one particular application, the methods disclosed herein may be employed in CMOS applications. For example, metal silicide layers 122 that are intended to be used with N-type transistor devices may be formed with about 50-90% atomic silicon. In contrast, metal silicide layers 122 that are intended to be used with P-type transistor devices may be formed with about 2-40% atomic silicon. The amount of silicon contained in the metal silicide layer 122 may be controlled by, for example, varying the amount of a silicon-containing precursor, such as silane, disilane, tri-silane, etc., that is used when depositing the metal silicide layer 122. Other illustrative techniques that may be employed to control the amount of silicon contained in the metal silicide layer 122 include, but are not limited to, controlling the temperature of the deposition process, controlling the duration of time during which precursors are introduced into the process chamber, etc. The exact process parameters will need to be determined by experiment with the exact process flow and materials used in each application. FIG. 3B is a plot of the effective work function (vertical axis) of the overall gate stack that includes the metal silicide layer 122 as a function of the thickness (horizontal axis) of the metal silicide layer 122 in the case where the metal silicide layer 122 is comprised of tungsten silicide. Additionally, in FIG. 3B, the amount of atomic silicon present in the metal silicide layer 122 is at a constant level of about 63%. As can be seen by the curve in FIG. 3B, the curve is fairly flat when the thickness of the metal silicide layer 122 is below about 0.3-0.5 nm, trends downward with increasing thickness of the metal silicide layer 122, then begins to flatten out again when the thickness of the metal silicide layer 122 reaches a value of about 3 nm. As can be seen from FIG. 3B, for a constant atomic percentage of silicon (about 63%), the effective work function of the overall gate stack that includes the metal silicide layer 122 may be varied from about 4.85 eV to about 4.5 eV by changing the thickness of the metal silicide layer 122 from about 0.1-5 nm, and saturates beyond about 5 nm.

In addition to some of the benefits described above, in at least some applications, by using the metal silicide layer 122 disclosed herein, the resistance of the metals used in the final gate structure for the transistor 104 may be greatly decreased relative to prior art transistor structures. As one example, for a typical prior art N-type transistor device, the work function adjusting metal employed in such a device might be titanium-aluminum-carbon (TiAlC) having a thickness of about 2-10 nm. Such a layer of titanium-aluminum-carbon (TiAlC) was typically positioned between two layers of titanium nitride. A layer of titanium-aluminum-carbon (TiAlC) typically has a resistivity value of about 2000 μohms-cm. Using the methods disclosed herein, an N-type transistor device may be formed using the above-described metal silicide layer 122 in lieu of the titanium-aluminum-carbon (TiAlC) layer (and without the capping titanium nitride layer as well in some applications). Importantly, the metal silicide layer 122 disclosed may have a resistivity value of about 200 μohms-cm—approximately an order of magnitude less than that of titanium-aluminum-carbon (TiAlC)—a material that is frequently employed as a work function adjusting metal on N-type transistor devices. Of course, such a dramatic change in resistance values may not be present in all situations, as it depends upon the materials of construction that are the basis of the comparison. However, as will be appreciated by those skilled in the art after a complete reading of the present application, such a reduction in the resistance value of at least some of the materials used in the gate structures of transistor devices can provide significant advantages as it relates to the design and manufacture of integrated circuit products.

Figure 2F:
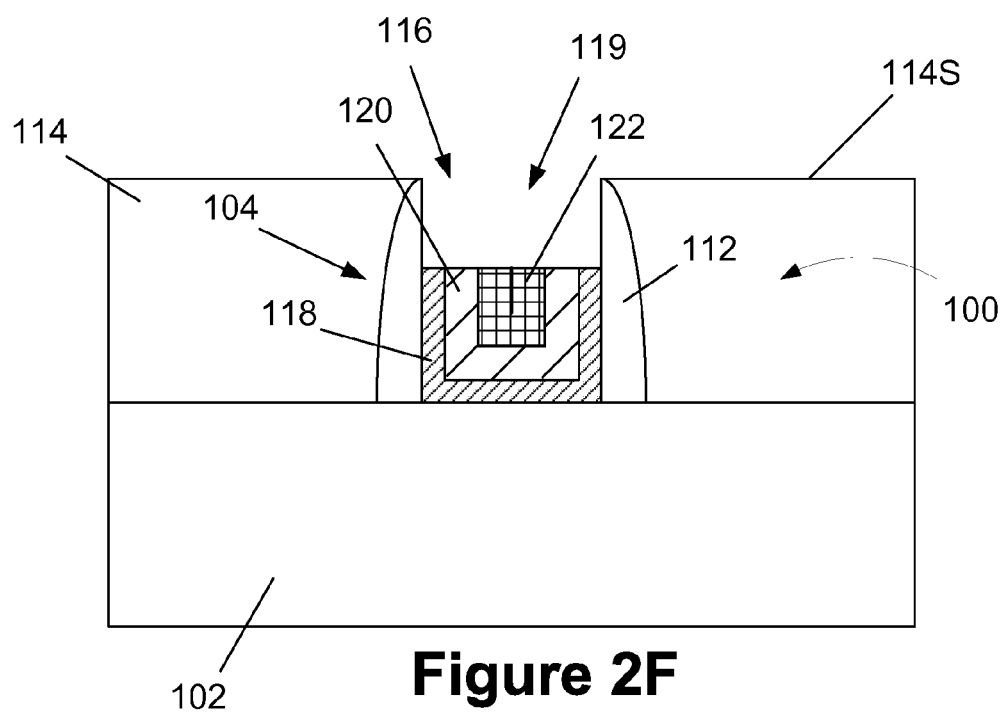

FIG. 2F depicts the product 100 after several processing operations were performed on the device. In one embodiment, one or more CMP processes were performed to remove the portions of the layers 118, 120 and 122 positioned above the surface 114S of the layer of insulating material 114 and outside of the gate cavity 116. Thereafter, one or more dry or wet etching process were performed on the high-k gate insulation layer 118, the first metal layer 120 and the metal silicide layer 122 to form a recess 119 in the gate cavity 116. The depth of the recess 119 may vary depending upon the particular application, e.g., about 10-20 nm. In some applications, the CMP processes may be omitted and the structure depicted in FIG. 2F may be achieved by simply performing one or more etching processes.

Figure 2G:
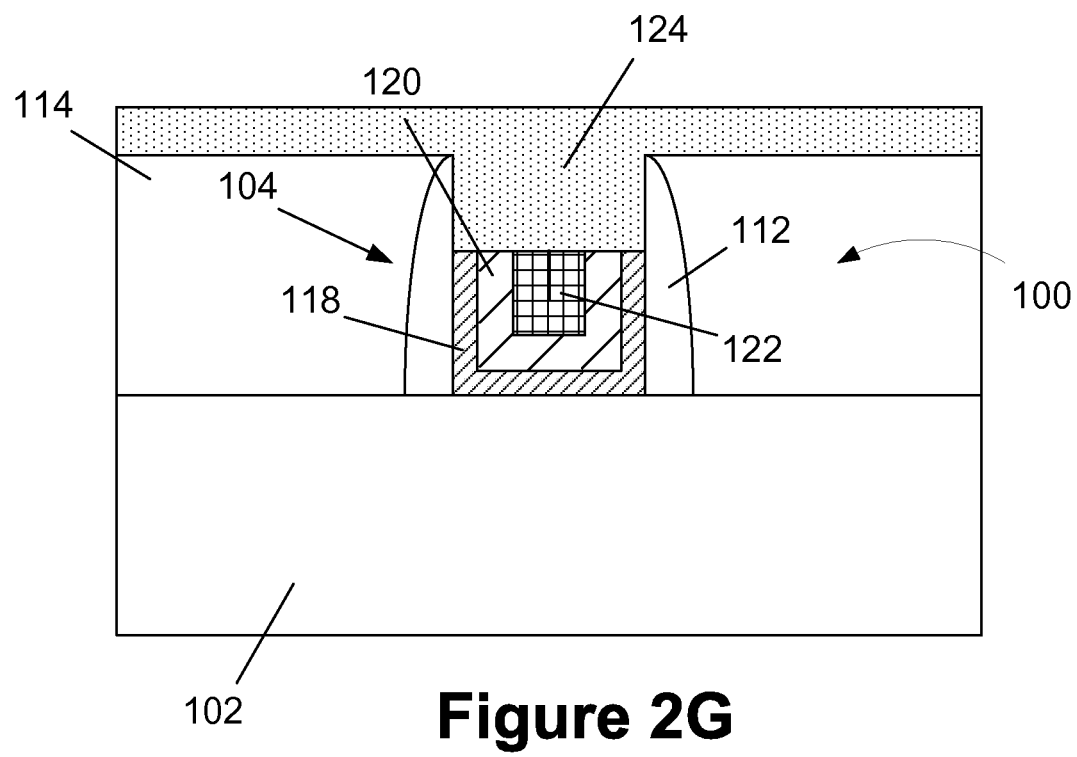

FIG. 2G depicts the product 100 after a second metal layer 124 was blanket-deposited on the product 100 so as to overfill recess the 119 in the gate cavity 116. The second metal layer 124 may be comprised of a variety of conductive materials, e.g., tungsten, aluminum, cobalt, nickel, etc., and it may be formed by performing, for example, a CVD or PVD process. The second metal layer 124 may be formed to any desired thickness.

Figure 2H:
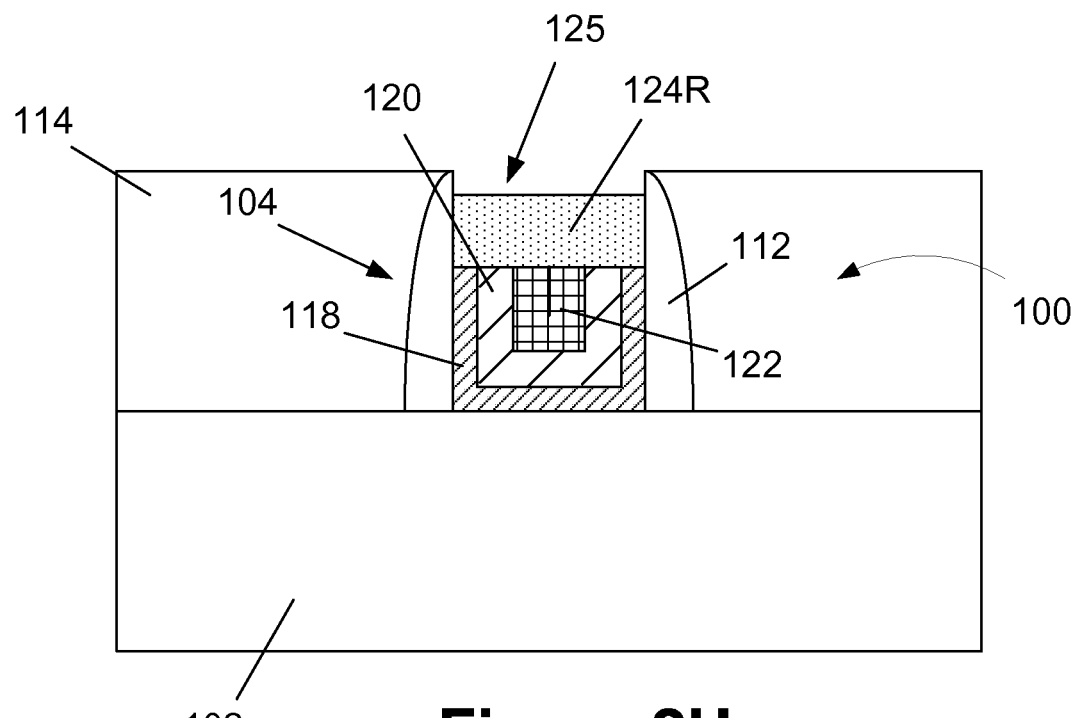

FIG. 2H depicts the product 100 after a dry or wet etching process was performed on the second metal layer 124 to thereby produce a recessed second metal layer 124R having a recessed upper surface that defines a recess 125. In one embodiment, the recessing process may be a timed etching process. In one illustrative example, the recessing process is performed in such a manner that the depth of the recess 125 is about 10-20 nm.

Figure 2I:
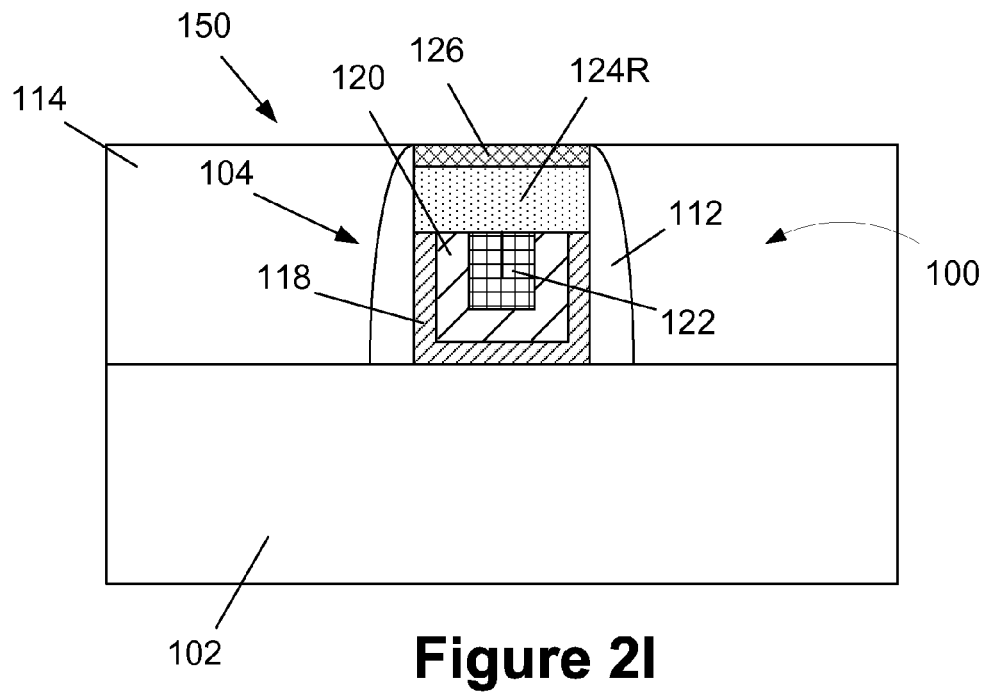

FIG. 2I depicts the product 100 after several process operations were performed. First, a layer of gate cap material, e.g., silicon nitride, was blanket-deposited above the product 100. Thereafter, a planarization process was performed on the layer of gate cap material to thereby define a gate cap layer 126 for the transistor 104. In one illustrative embodiment, the planarization process may be a chemical mechanical planarization (CMP) process that stops on the layer of insulating material 114.

At this point in the process flow, the final gate structure 150 for the transistor 104 has been formed. The gate cap layer 126 has also been formed to protect the final gate structure 150. Using the methods disclosed herein, the stack of material layers for the final gate structure 150 may be formed by depositing fewer layers of material within the gate cavity 116, especially as it relates to N-type devices. This leaves significantly more room within the gate cavity 116 to form the additional needed metal materials within the gate cavity 116. More importantly, the methodologies disclosed herein are equally compatible with forming replacement gate structures for PMOS devices, as shown above. Thus, the methods disclosed herein have significant value as it relates to forming integrated circuit products using CMOS technology. Other benefits will be apparent to those skilled in the art after a complete reading of the present application. At the point of fabrication depicted in FIG. 2I, the integrated circuit product 100 may be completed by performing several traditional manufacturing processes, e.g., the formation of contacts to the source/drain regions of the device, the formation of various metallization layers for the product, etc.

Figure 4A:
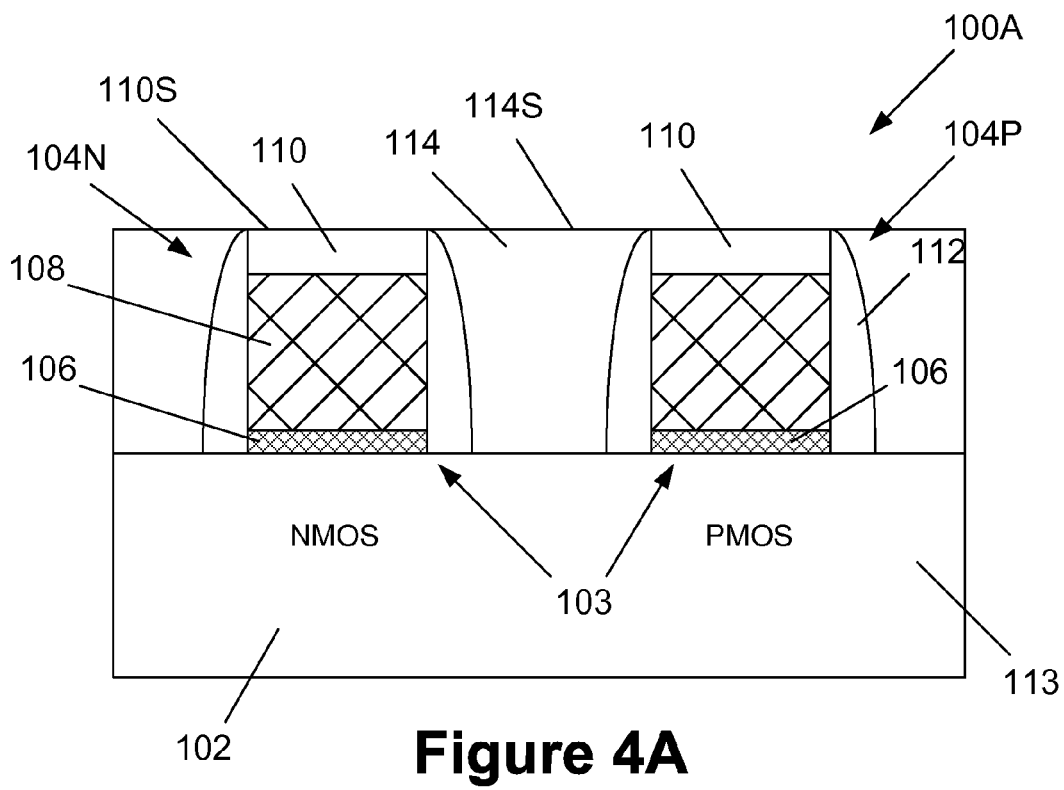
FIGS. 4A-4H depict yet another illustrative method disclosed herein for forming gate structures for transistor devices and an example of an integrated circuit product formed using CMOS technology.

FIGS. 4A-4H depict yet another illustrative method disclosed herein for forming gate structures for transistor devices and an example of an integrated circuit product 100A that is formed using CMOS technology. An illustrative NMOS transistor 104N and an illustrative PMOS transistor 104P will be formed in and above the semiconductor substrate 102. In the example disclosed herein, the transistors 104N, 104P will be formed using a replacement gate technique. Accordingly, FIG. 4A depicts the product 100A at a point in fabrication wherein sacrificial gate structures 103 have been formed above the substrate 102. As noted above, at this point in the replacement gate process flow, source/drain regions (not shown) would have already been formed in the substrate 102 and an anneal process would have been performed to activate the implanted dopant materials and repair any damage to the substrate 102 due to the various ion implantation processes that were performed. The sacrificial gates structures 103 include the above-described sacrificial gate insulation layer 106 and dummy or sacrificial gate electrode 108. Also depicted are the above-described sidewall spacers 112, gate cap layers 110 and layer of insulating material 114. At the point of fabrication depicted in FIG. 4A, a planarization process has been performed on the layer of insulating material 114 such that the upper surface 114S of the layer of insulating material 114 is substantially even with the upper surface 110S of the gate cap layers 110 so that they can be removed.

Figure 4B:
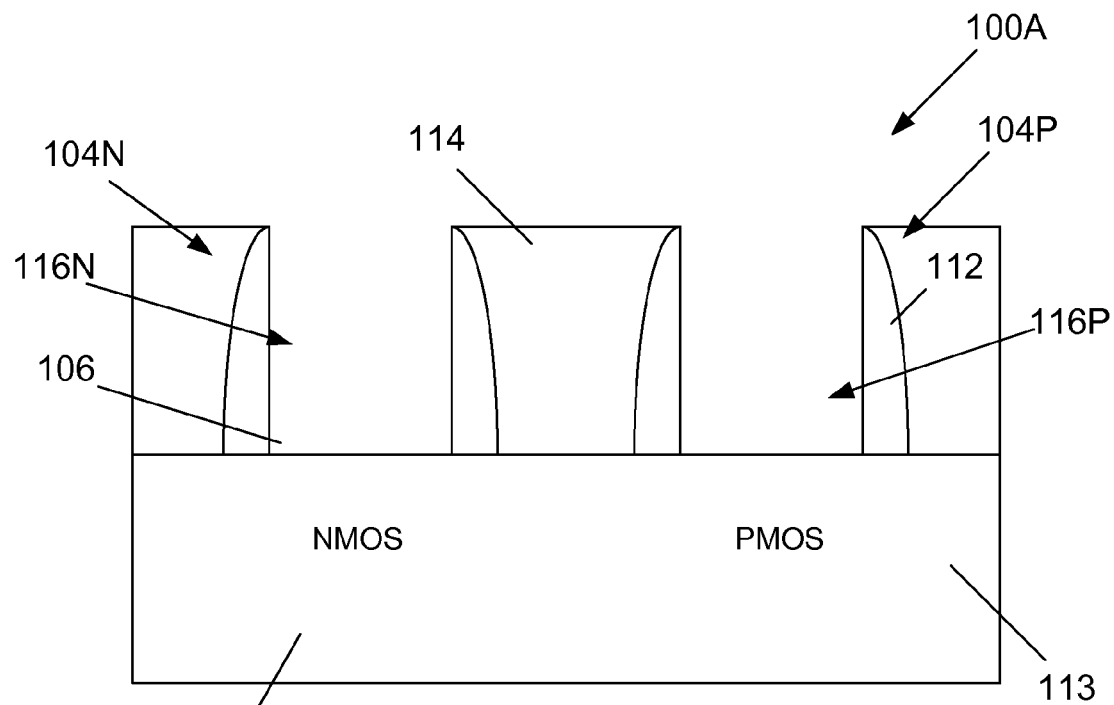

FIG. 4B depicts the product 100A after several process operations, e.g., planarization and/or etching processes, were performed to remove the gate cap layers 110, the sacrificial gate electrodes 108 and the sacrificial gate insulation layers 106 to thereby define gate cavities 116N, 116P where a replacement gate structure will subsequently be formed for the N-type transistor 104N and the P-type transistor 104P, respectively. Typically, the sacrificial gate insulation layers 106 are removed as part of the replacement gate technique, as depicted herein. However, the sacrificial gate insulation layers 106 may not be removed in all applications. Even in cases where the sacrificial gate insulation layers 106 are intentionally removed, there will typically be a very thin native oxide layer (not shown) that forms on the substrate 102 within the gate cavities 116N, 116P.

Figure 4C:
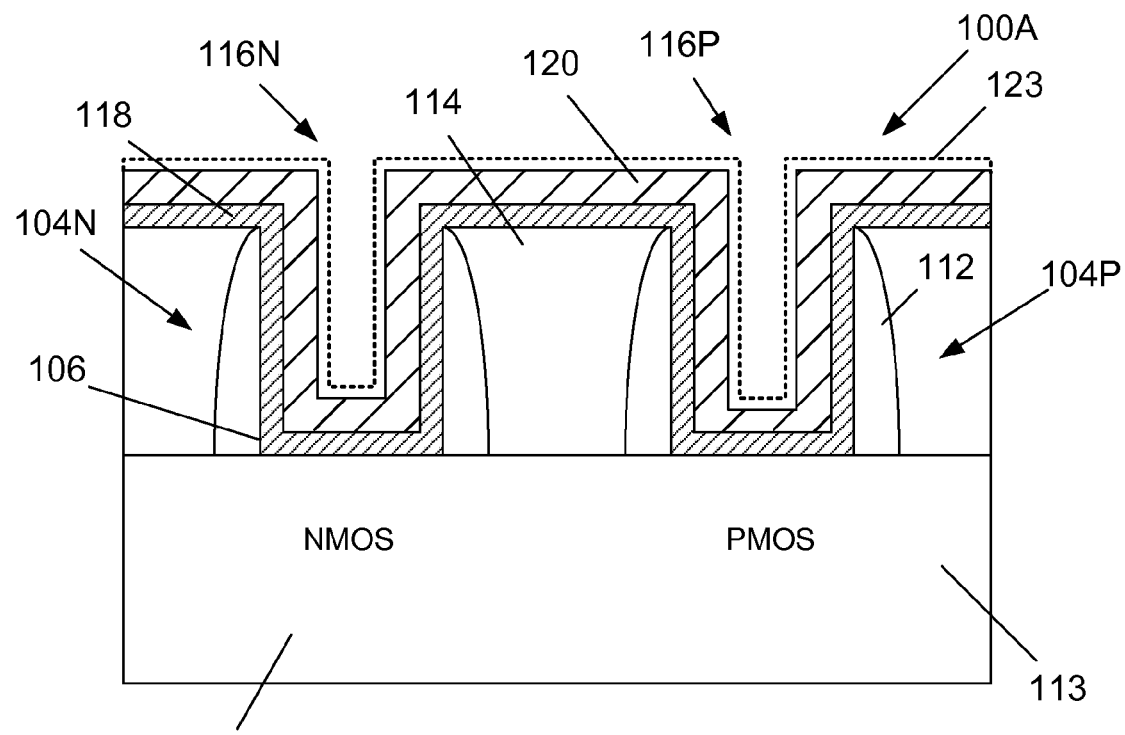

FIG. 4C depicts the product 100A after several process operations were performed. First, a pre-clean process was performed in an attempt to remove all foreign materials from within the gate cavities 116N, 116P prior to forming the various layers of material that will become part of the replacement gate structures. Thereafter, the above-described high-k gate insulation layer 118 was formed within the gate cavities 116N, 116P and the first metal layer 120 was formed on the high-k gate insulation layer 118. Next, after forming a layer of polysilicon or amorphous silicon (not shown) above the first metal layer 120, the above-described high-k reliability anneal process was performed. Then, the layer of polysilicon or amorphous silicon was removed. As noted above, the first metal layer 120 that was used during the reliability anneal process may remain in place while, in other applications, the first metal layer 120 that was used in the reliability anneal process may be removed and replaced with a "new" first metal layer 120. Also depicted in FIG. 4C (in dashed lines) is the above-described optional adhesion layer 123 that may be required or desired in some applications. As before, the layer 123 will not be depicted in any subsequent drawings.

Using the methods described herein, the metal silicide layer 122 described above may be tailored for either N-type or P-type devices, thus making it an attractive option for forming work function adjusting layers in CMOS applications. Using the illustrative process flow described herein, a metal silicide layer 122N that is tailored for the NMOS device 104N will be formed first. However, after a complete reading of the present application, those skilled in the art will appreciate that a tailored metal silicide layer 122P that is tailored for the PMOS device could have been formed first if desired.

Figure 4D:
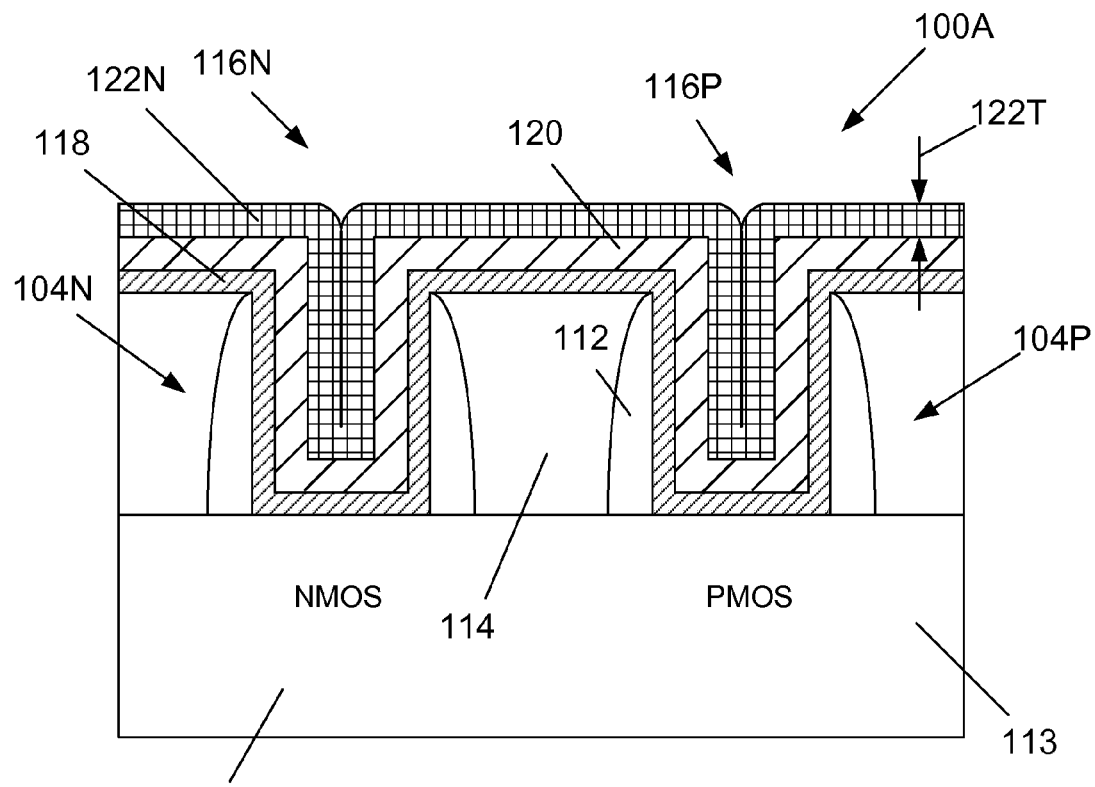

Accordingly, FIG. 4D depicts the product 100A after a metal silicide layer 122N that has an atomic silicon content tailored for the NMOS device 104N is deposited on the product 100A so as to substantially over-fill both of the remaining portions of the gate cavities 116N, 116P. In one illustrative embodiment, the metal silicide layer 122N may be formed with about 50-95% atomic silicon. The metal silicide layer 122N may be formed using the methods and materials described above with respect to the metal silicide layer 122.

Figure 4E:
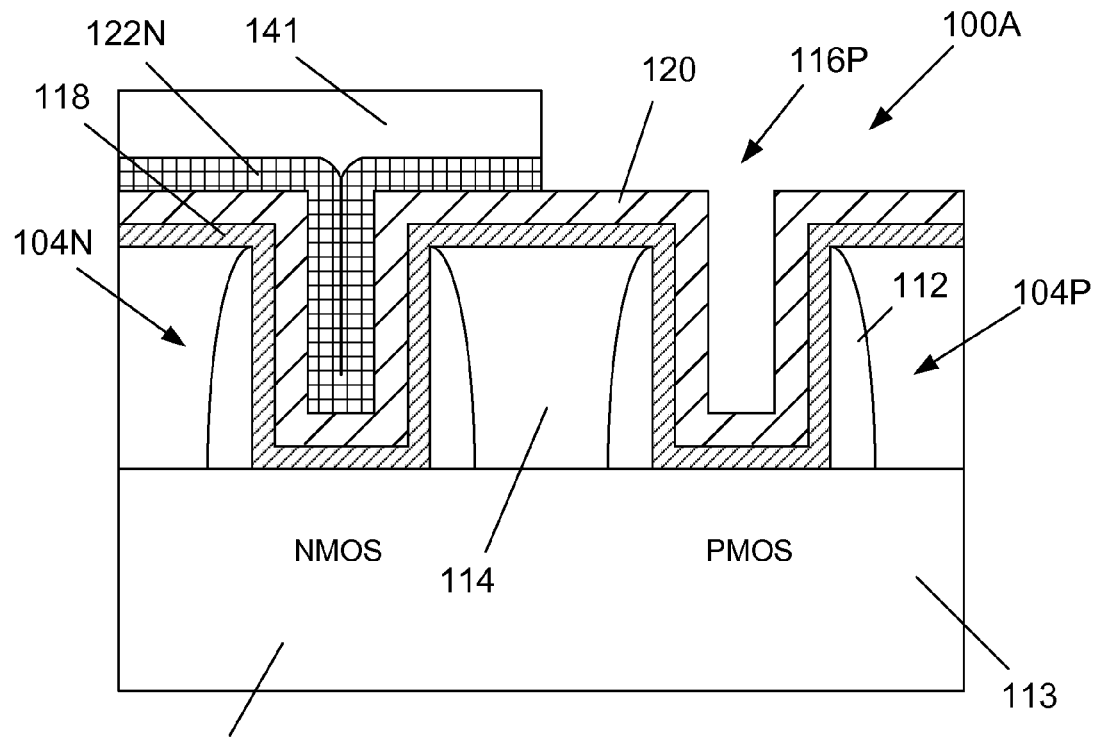

FIG. 4E depicts the product 100A after several process operations were performed. First, a patterned masking layer 141 was formed above the product 100A. The patterned masking layer 141 covers the NMOS region while leaving the PMOS region exposed for further processing. In one embodiment, the patterned masking layer 141 may be a patterned layer of photoresist material that may be formed using known photolithography tools and techniques or it may be a patterned hard mask layer, such as a layer of silicon nitride. Next, a dry or wet etching process was performed to remove the exposed portions of the metal silicide layer 122N, thereby re-exposing some of the gate cavity 116P for the PMOS transistor 104P.

Figure 4F:
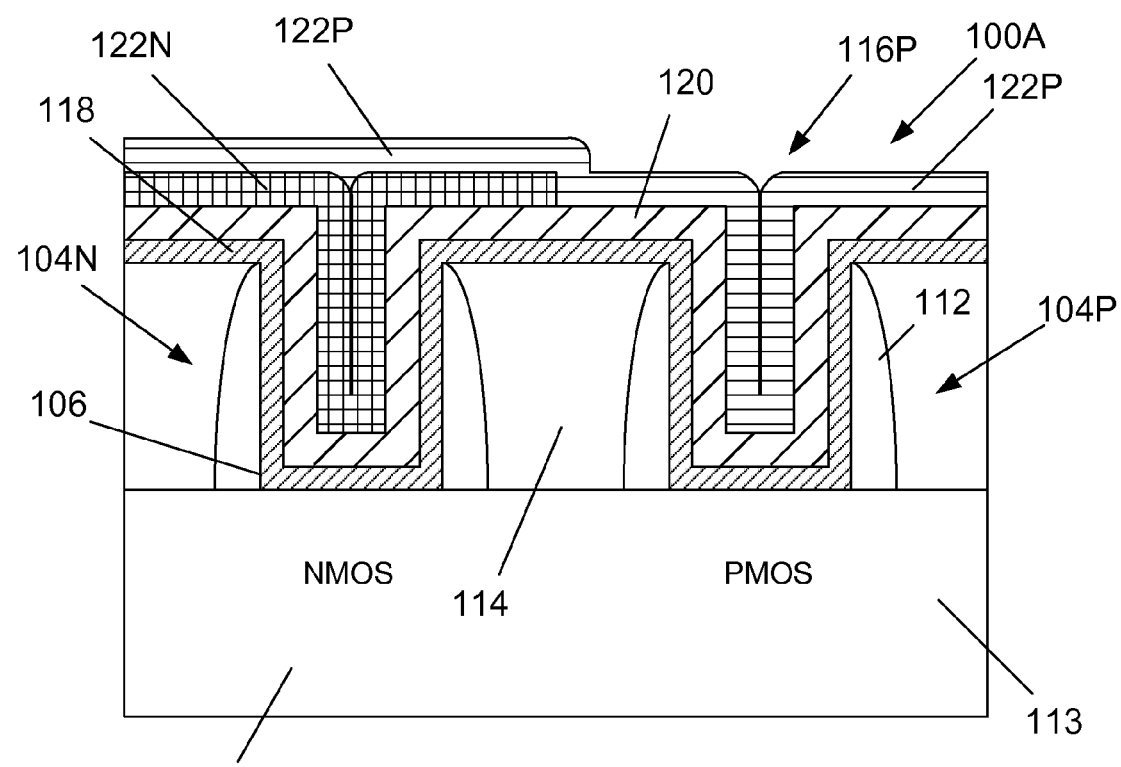

FIG. 4F depicts the product 100A after several process operations were performed. First, the patterned mask layer 141 was removed. Then, a second metal silicide layer 122P that has an atomic silicon content tailored for the PMOS device 104P was deposited on the product 100A so as to substantially over-fill the remaining portions of the gate cavity 116P. In one illustrative embodiment, the metal silicide layer 122P may be formed with about 2-40% atomic silicon. The metal silicide layer 122P may be formed using the methods and materials described above with respect to the metal silicide layer 122. In general, the amount of atomic silicon in the metal silicide layer 122N (for the NMOS device 104N) will be greater than the amount of atomic silicon in the metal silicide layer 122P (for the PMOS device 104P). Typically, the amount of atomic silicon present in the metal silicide layer 122N for the NMOS device may be at least ten (10) atomic percent greater than the amount of atomic silicon present in the metal silicide layer 122P for the PMOS device. Also note that, using the methods disclosed herein to form transistors in CMOS applications, the metal silicide layers 122N, 122P may not be made of the same metal silicide, although that situation may occur in some applications.

Figure 4G:
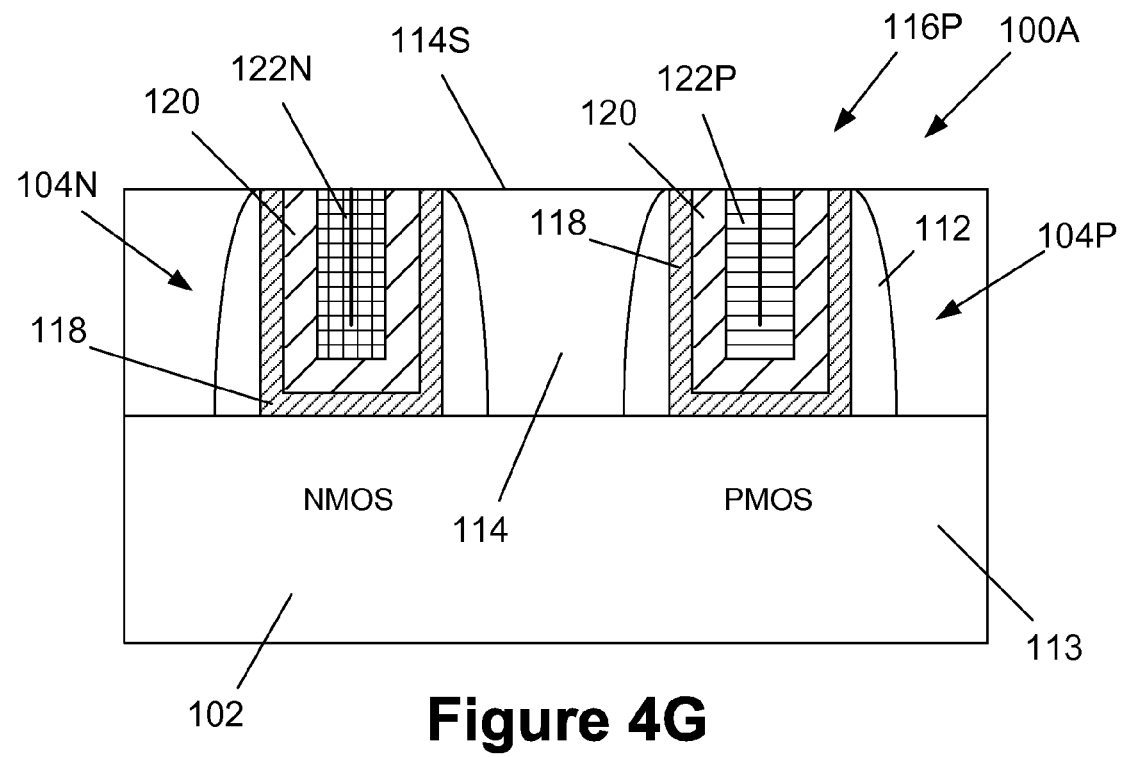

FIG. 4G depicts the product 100A after one or more planarization processes have been performed to remove the portions of the metal silicide layers 122N, 122P, the first metal layer 120 and the high-k gate insulation layer 118 that are positioned above the surface 114S of the layer of insulating material 114 and outside of the gate cavities 116N, 116P. The structure depicted in FIG. 4G may be achieved by performing one or more CMP and/or etching processes in any of a variety of different processing sequences.

Figure 4H:
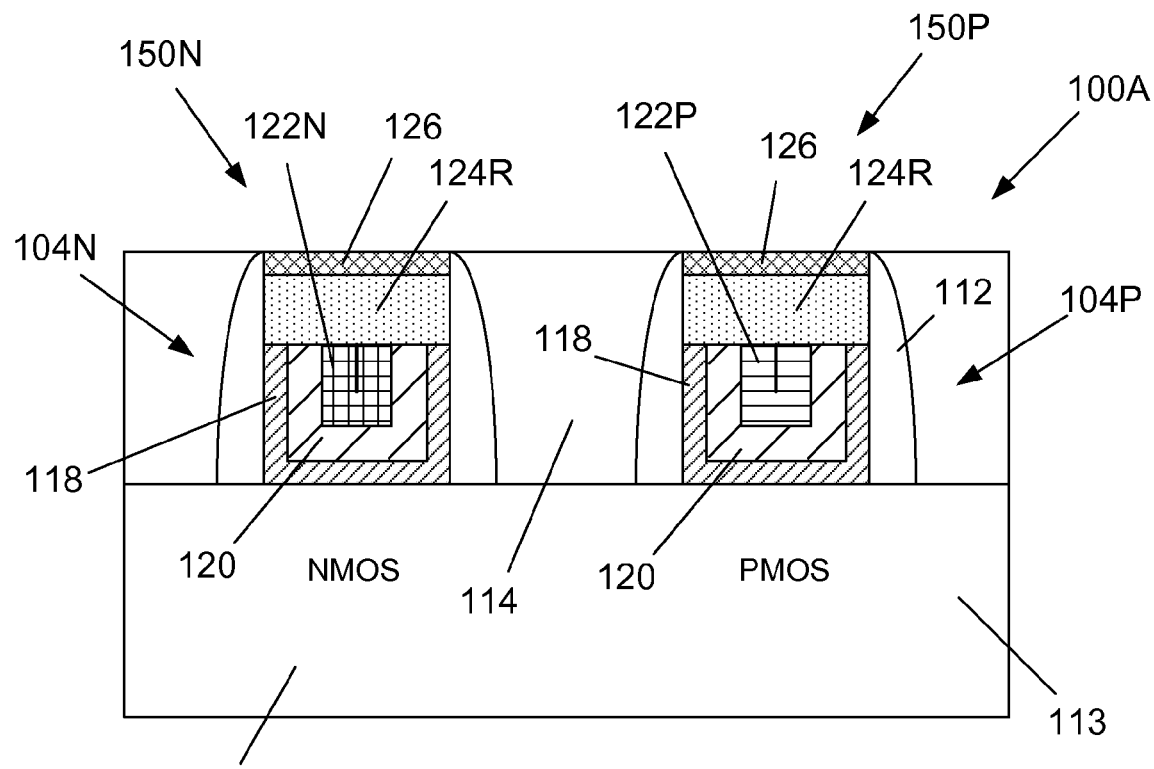

FIG. 4H depicts the product 100A after the processing sequence described above in connection with FIGS. 2G-2I was performed to result in the formation of the second metal layer 124R and the gate cap layer 126 as depicted in the drawing. At this point in the process flow, the final gate structures 150N, 150P for the transistors 104N, 104P, respectively, have been formed. At the point of fabrication depicted in FIG. 4H, the integrated circuit product 100A may be completed by performing several traditional manufacturing processes, e.g., the formation of contacts to the source/drain regions of the device, the formation of various metallization layers for the product, etc.

Figure 5A:
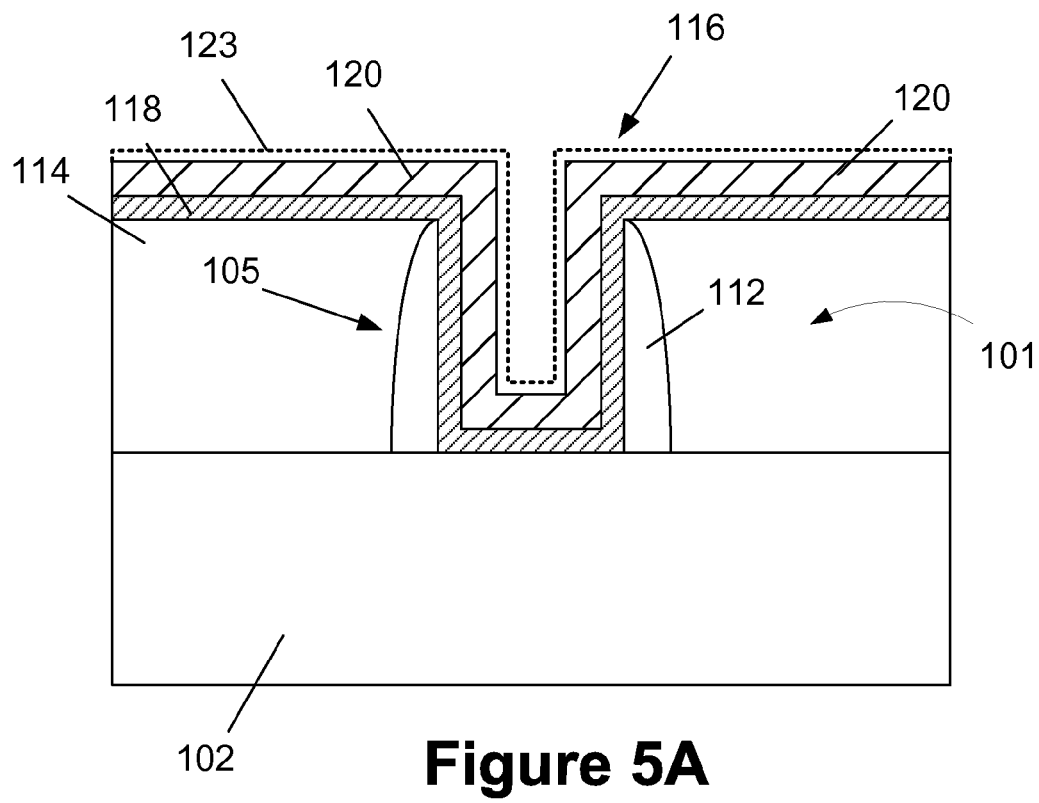
FIGS. 5A-5E depict yet another illustrative method disclosed herein for forming gate structures for transistor devices and an example of an integrated circuit product that contain such transistor devices.

FIGS. 5A-5E depict yet another illustrative method disclosed herein for forming a gate structure for a transistor device 105 and an example of an integrated circuit product 101 that contains such a transistor. In the example disclosed herein, the transistor 105 will be formed using a replacement gate technique. FIG. 5A depicts the product 101 at a point in fabrication that approximately corresponds to that depicted in FIG. 2D, i.e., the sacrificial gate structure of the transistor 105 has been removed and the above-described high-k gate insulation layer 118 was formed within the gate cavity 116 and the first metal layer 120 was formed on the high-k gate insulation layer 118. The above-described high-k reliability anneal process would have also been performed at this point in the process flow. As noted above, the first metal layer 120 depicted in FIG. 5A may have been used in the reliability anneal of the high-k gate insulation layer 118 or it may be a "new" first metal layer 120. Also depicted in FIG. 5A (in dashed lines) is the above-described optional adhesion layer 123 that may be required or desired in some applications. As before, the layer 123 will not be depicted in any subsequent drawings.

Figure 5B:
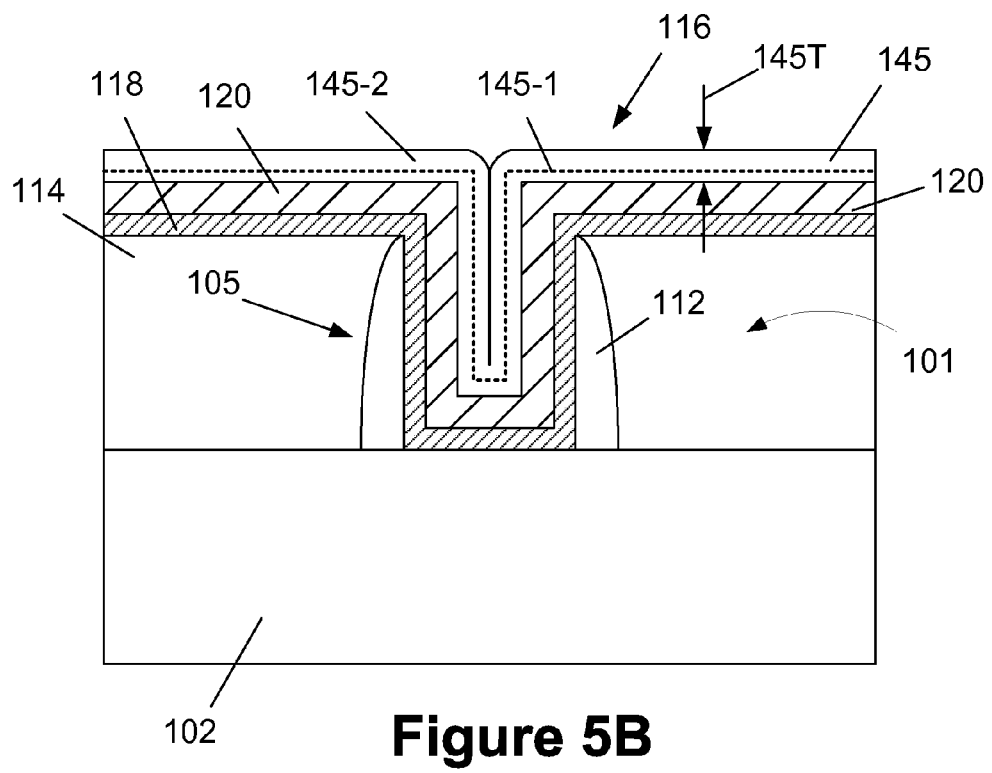

FIG. 5B depicts the product 101 at a point in fabrication wherein an illustrative metal layer 145 is formed above the product 101. In one illustrative embodiment, the metal layer 145 may be comprised of a single layer of metal or multiple layers of metal, such as the illustrative first metal layer 145-1 (depicted in dashed lines) and a second layer of metal 145-2 formed thereabove. The number of such metal layers may vary depending upon the particular application. For ease of reference, the situation where multiple layers of metal may be formed above the first metal layer 120 will not be depicted in the subsequent drawings. The metal layer(s) 145 may be comprised of any of a variety of metals, e.g., tungsten, hafnium, tantalum, titanium, nickel, platinum, a refractory metal or a transition metal, or combinations of such materials, etc. The metal layer(s) 145 may also be deposited to any desired thickness 145T, e.g., 10-300 nm. In some applications, the metal layer(s) 145 may be formed in such a manner such that few, if any, voids are present in the cavity 116. In other applications, due to the limited width of the gate cavity 116, when the metal layer(s) 145 is formed, it may tend to "pinch-off" the gate cavity 116, thereby creating a void or seam in the metal layer(s) 145 within the cavity 116. In the case where such a void is formed, the gate metal material that will be subsequently formed (as described more fully below) may fill all or a portion of such a void. For purposes of disclosing the present inventions, the metal layer(s) 145 will be depicted as having been formed in such a manner so as to result in a substantially void-free metal layer(s) 145.

Figure 5C:
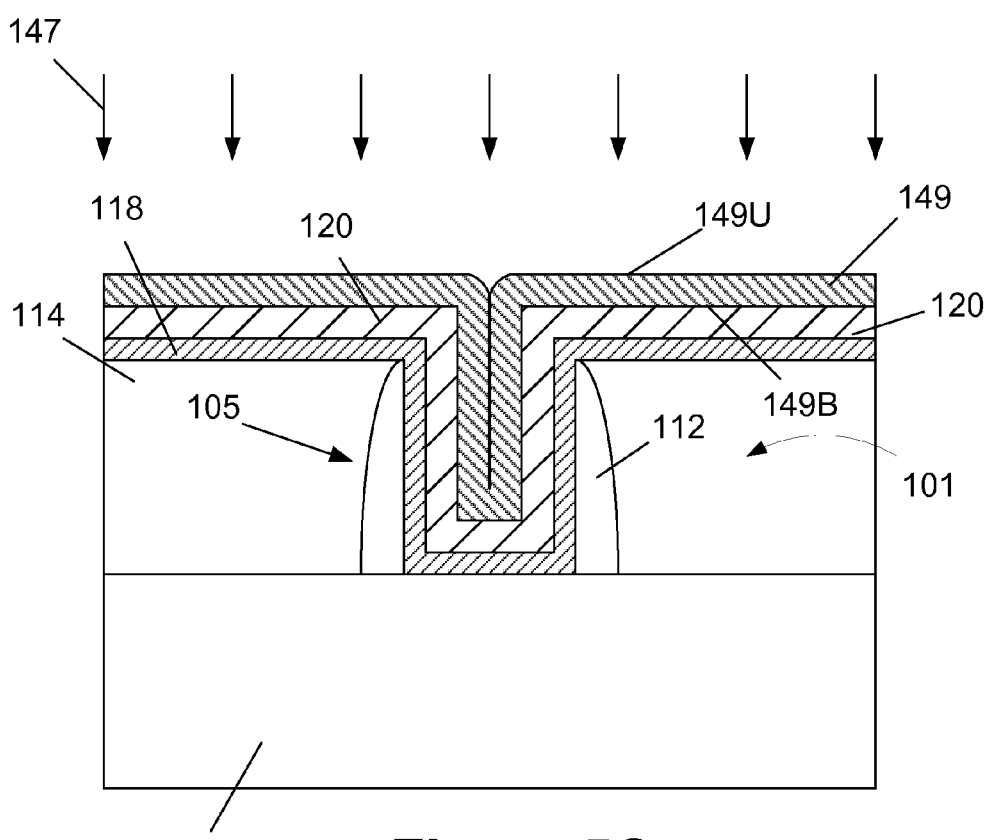

Next, as shown in FIG. 5C, one or more process operations 147 will be performed on the metal layer(s) 145 to convert all or a portion of the metal layer 145 into a metal silicide layer(s) 149. In general, the process operation 147 involves introducing atomic silicon in to the metal layer(s) 145. In the case where multiple layers of metal are formed, e.g., metal layers 145-1 and 145-2, separate process operations 147 may be performed after each individual metal layer is formed or the process operation 147 may be performed after all of the multiple metal layers 145 (e.g., the layers 145-1 and 145-2) are formed. In the case where multiple layers of material are formed, the multiple layers of material may all be comprised of the same metal or they may be comprised of different metals. Moreover, in the case where multiple layers of metal are formed, the parameters of individual process operations 147 that are performed after the formation of each layer of metal may be different as well, e.g., the amount of atomic silicon introduced during each individual process operation 147 may be different.

In one illustrative embodiment, the process operation 147 may be a plasma treatment process or a thermal treatment process performed in a process ambient comprised of a silicon-containing precursor. For example, a silicon-containing precursor such as silane, disilane, tri-silane, etc. may be introduced into a process chamber (not shown) at a flow rate of about 5-3000 sccm. Of course, the process conditions can vary based upon, among other things, the design of the process chamber and the desired composition of the metal silicide layer(s) 149.

In the case of a plasma-based process operation 147, the process operation 147 may be performed at a temperature that falls within the range of about 25-1000° C. and at a pressure that falls within the range of about 0.1-100 Torr. Such a plasma-based process operation may be performed for a duration of about 0.1-1000 seconds, depending upon the thickness of the metal layer(s) 145. The plasma power may fall within the range of about 10-10,000 W and the frequency may fall within the range of about 100 kHz-45 MHz. Of course, the process conditions can vary based upon, among other things, the design of the process chamber and the desired composition of the metal silicide layer(s) 149.

In another example, the process operation 147 may be a thermal treatment process operation that is performed in a silicon-containing process ambient that results in the formation of the metal silicide layer 149. In one embodiment, such a thermal treatment process may be performed at a temperature that falls within the range of about 200-1100° C. and at a pressures that falls within the range of about 0.1-760 Torr.

In the depicted example in FIG. 5C, the metal silicide layer 149 is shown as having the atomic silicon uniformly distributed throughout the thickness of the metal silicide layer 149. In practice, the depth of penetration of the atomic silicon that is introduced by way of the process operation 147 may vary depending upon the particular application, i.e., atomic silicon may not penetrate the entire thickness of the metal layer(s) 145. In practice, the concentration of the atomic silicon within the metal silicide layer 149 may not be uniform. Moreover, in some applications, the parameters of the process operation(s) 147 may be intentionally varied such that there is a variation in the amount of atomic silicon throughout the thickness of the metal silicide layer 149. For example, the process operation(s) 147 may be controlled such that there is a higher concentration of atomic silicon in the metal silicide layer 149 at the bottom surface 149B of the metal silicide layer 149, i.e., at the interface with the first metal layer 120, than there is at the upper surface 149U of the metal silicide layer 149. One way to obtain a metal silicide layer 149 with such a variation in atomic silicon involves reducing the amount of silicon-containing precursors used in the process operation(s) 147 (either continuously or in a step-wise fashion) as the process operation(s) 147 proceeds. Of course, if desired, the process operation(s) 147 could be performed in such a manner that there is a higher concentration of atomic silicon in the metal silicide layer 149 at the upper surface 149U of the metal silicide layer 149 than there is at the bottom surface 149B of the metal silicide layer 122. Other illustrative techniques that may be employed to control the amount of silicon contained in the metal silicide layer 149 include, but are not limited to, controlling the temperature of the process operation 147, controlling the duration of time during which precursors are introduced into the process chamber, etc.

The inventors have discovered that, by varying the amount of silicon in the metal silicide layer(s) 149, the effective work function (EWF) of the overall gate stack that includes the metal silicide layer 149 may be controlled or "tuned" to a desired level. The data set forth in FIGS. 3A-3B apply equally to this aspect of the presently disclosed inventions. Thus, using the methods described herein, the metal silicide layer 149 described above may be tailored for either N-type or P-type devices, thus making it an attractive option for, among other things, forming work function adjusting layers in CMOS applications. The inventors have also discovered that annealing in inert atmosphere subsequent to the metal silicide deposition may reduce resistivity of the metal gate without having a major impact on the effective work function of the overall gate stack. An example of this includes a tungsten silicide system. The annealing process can be done at 250-1000° C., although higher temperature anneals may adversely impact dopant profiles. In one embodiment, such annealing may be performed in an argon environment, although other gases, such as $N_2$, He, $H_2$, etc., can also be used. In one embodiment, the pressure during such an anneal process may fall within the range of about 100 mT-760 Torr.

Figure 5D:
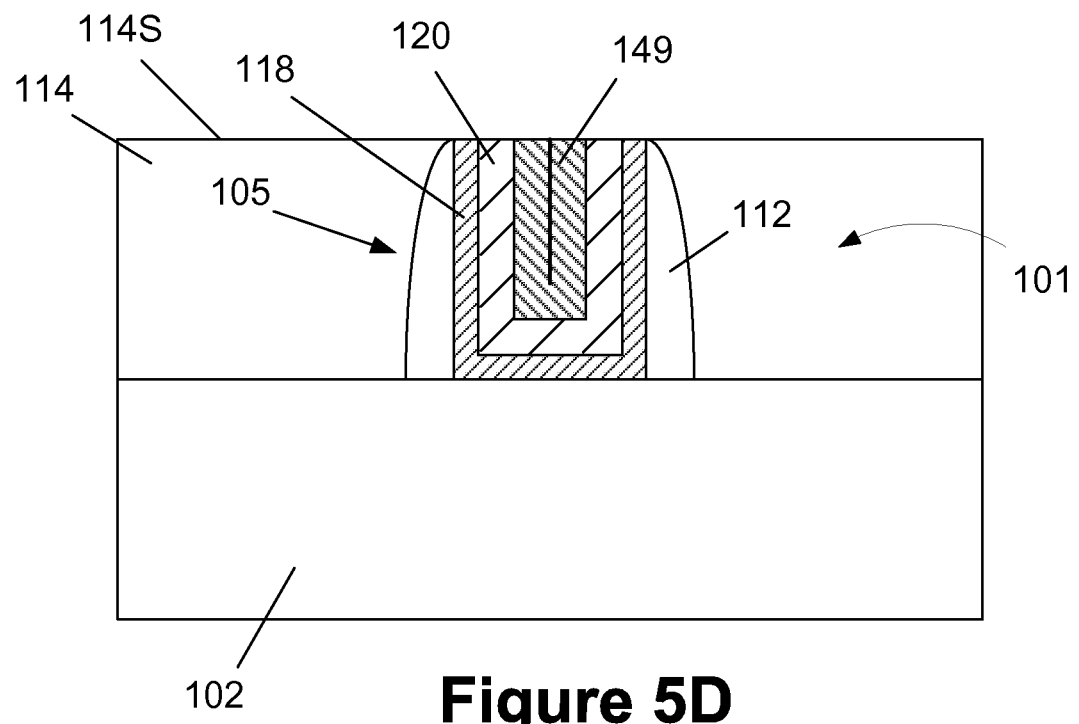

FIG. 5D depicts the product 101 after one or more planarization processes have been performed to remove the portions of the metal silicide layer(s) 149, the first metal layer 120 and the high-k gate insulation layer 118 that are positioned above the surface 114S of the layer of insulating material 114 and outside of the gate cavity 116. The structure depicted in FIG. 5D may be achieved by performing one or more CMP and/or etching processes in any of a variety of different processing sequences.

Figure 5E:
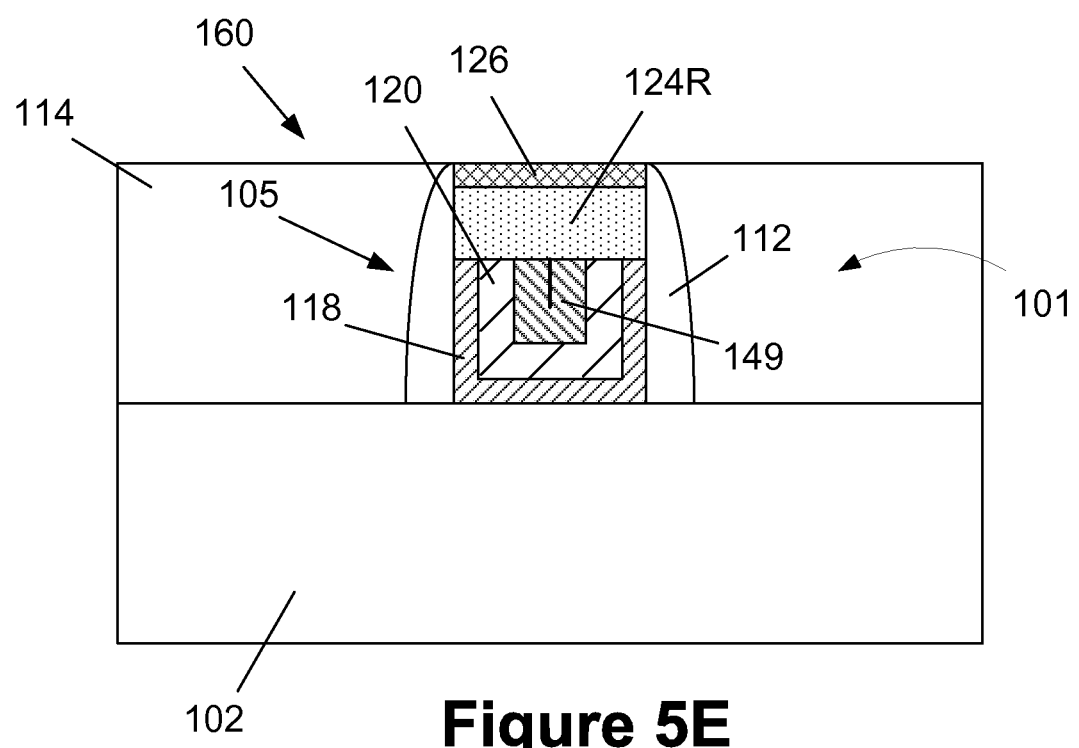

FIG. 5E depicts the product 101 after the processing sequence described above in connection with FIGS. 2G-2I was performed to result in the formation of the second metal layer 124R and the gate cap layer 126 as depicted in the drawing. At this point in the process flow, the final gate structure 160 for the transistor 105 has formed. At the point of fabrication depicted in FIG. 5E, the integrated circuit product 101 may be completed by performing several traditional manufacturing processes, e.g., the formation of contacts to the source/drain regions of the device, the formation of various metallization layers for the product, etc.

Figure 6A:
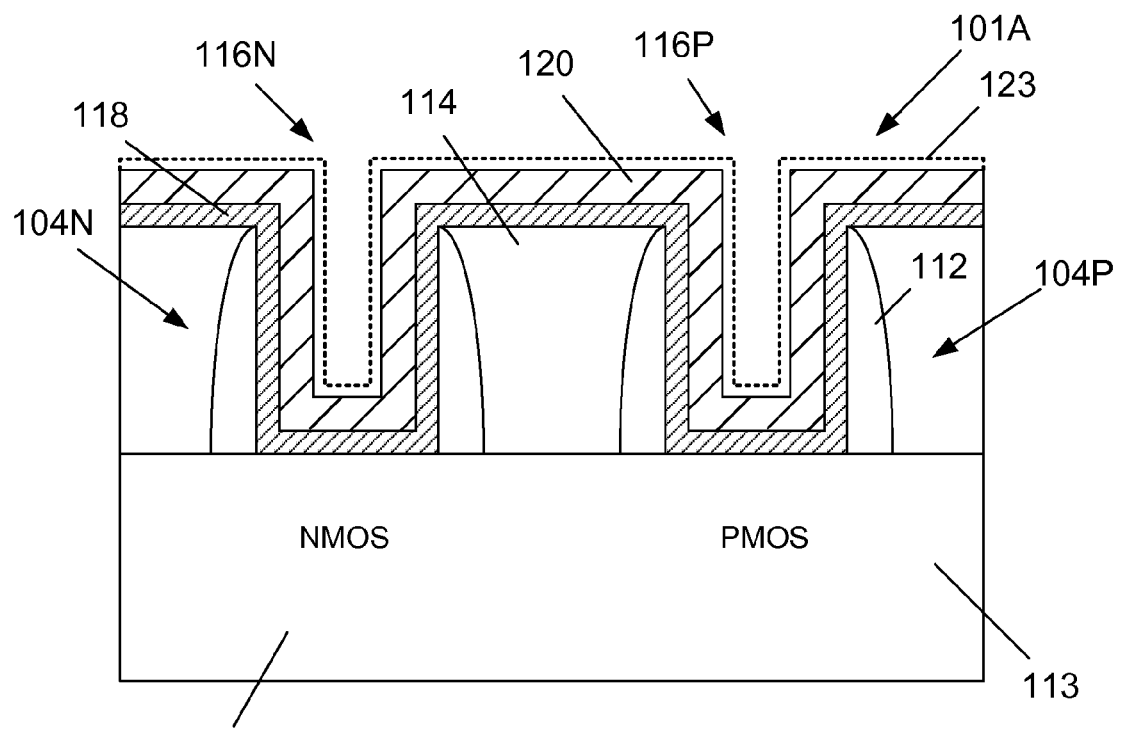
FIGS. 6A-6F depict yet another illustrative method disclosed herein for forming gate structures for transistor devices and an example of an integrated circuit product formed using CMOS technology.

FIGS. 6A-6F depict yet another illustrative method disclosed herein for forming gate structures for transistor devices and an example of an integrated circuit product 101A that is formed using CMOS technology. Accordingly, FIG. 6A depicts the product 101A at a point in fabrication that approximately corresponds to that depicted in FIG. 4C, i.e., the sacrificial gate structures of the transistors 104N, 104P have been removed and the above-described high-k gate insulation layer 118 was formed within the gate cavities 116N, 116P and the first metal layer 120 was formed on the high-k gate insulation layer 118. The above-described high-k reliability anneal process would have also been performed at this point in the process flow. As noted above, the first metal layer 120 depicted in FIG. 6A may have been used in the reliability anneal of the high-k gate insulation layer 118 or it may be a "new" first metal layer 120. Also depicted in FIG. 6A (in dashed lines) is the above-described optional adhesion layer 123 that may be required or desired in some applications. As before, the layer 123 will not be depicted in any subsequent drawings.

Figure 6B:
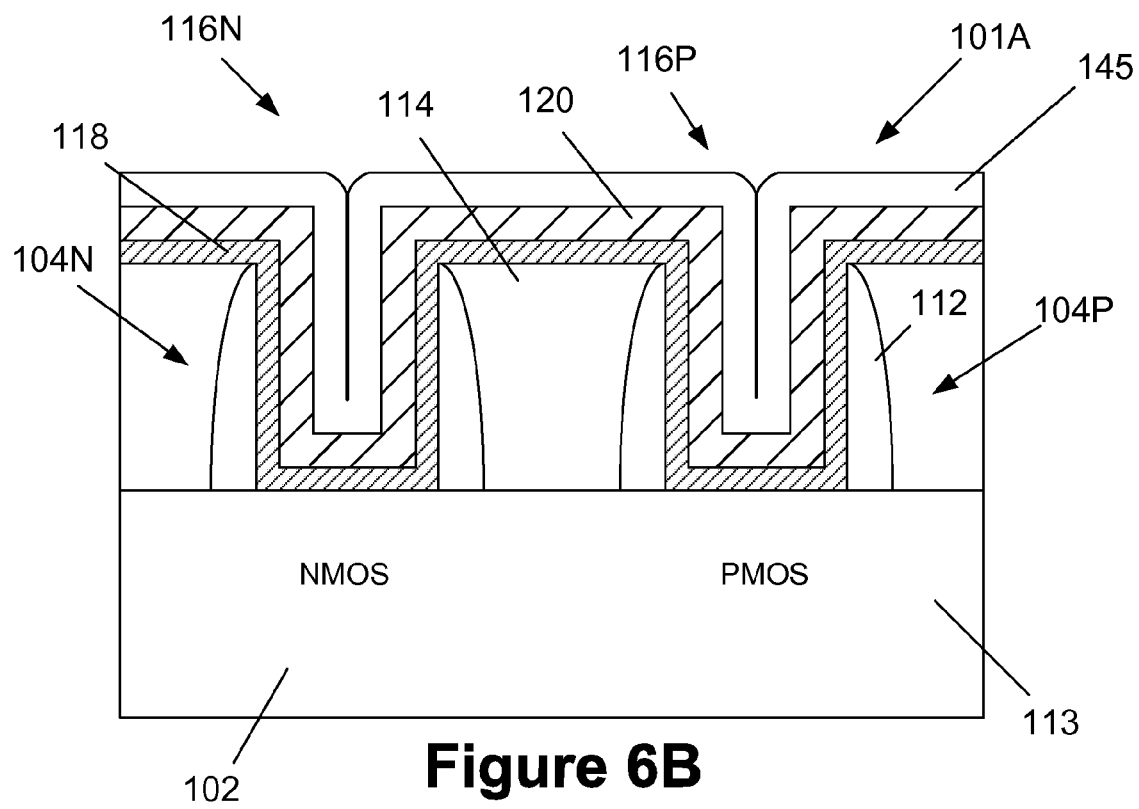

FIG. 6B depicts the product 101A after the above-described metal layer(s) 145 have been formed above the product 101A so as to substantially over-fill the gate cavities 116N, 116P. As noted above, the metal layer(s) 145 may be comprised of a single layer of metal or multiple layers of metal.

Figure 6C:
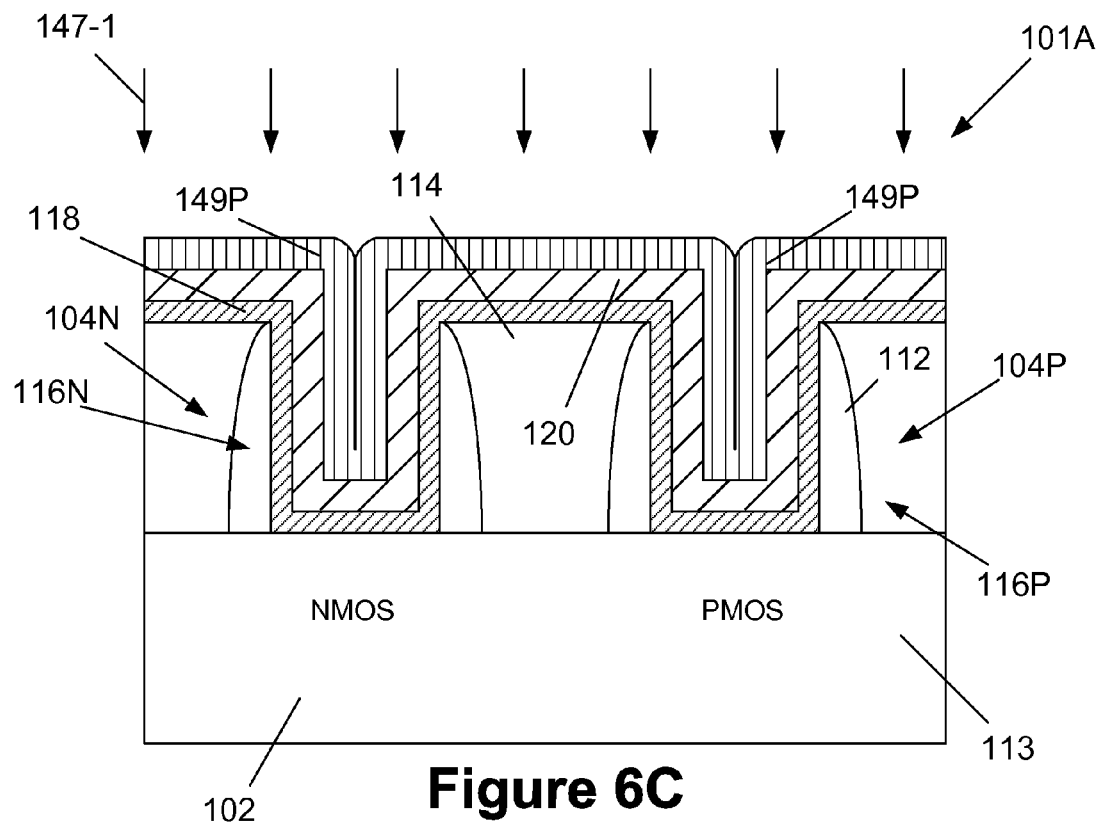

Typically, when processing is completed, the metal silicide work function adjusting material for the PMOS device 104P will have a lower relative concentration of atomic silicon as compared to the amount of atomic silicon that is present in the metal silicide work function adjusting material for the NMOS device 104N. Thus, as shown in FIG. 6C, in one illustrative process flow, a first process operation 147-1 may be performed to introduce an amount of atomic silicon into the entire metal layer 145 that corresponds to the lesser amount of atomic silicon used for the metal silicide work function adjusting metal silicide layer 149P of the PMOS transistor 104P. In one illustrative embodiment, the first process operation 147-1 may be performed such that the metal silicide layer 149P may be formed with about 2-40% atomic silicon. The process operation 147-1 may be any of the process operations 147 described above.

Figure 6D:
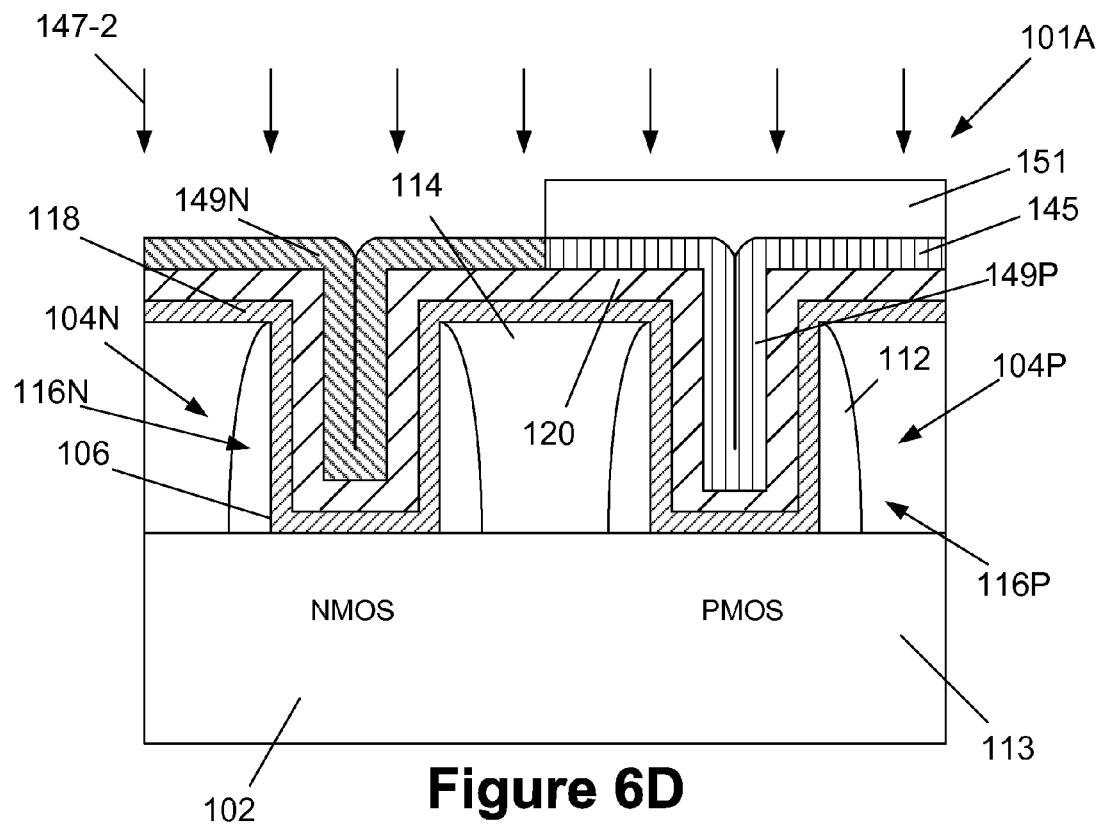

FIG. 6D depicts the product 101A after several process operations were performed. First, a patterned masking layer 151 was formed above the product 101A. The patterned masking layer 151 covers the PMOS region while leaving the NMOS region exposed for further processing, i.e., portions of the metal silicide layer 149 above the NMOS region are exposed for further processing. In one embodiment, the patterned masking layer 151 may be a patterned layer of photoresist material that may be formed using known photolithography tools and techniques or it may be a patterned hard mask layer, such as a layer of silicon nitride. Next, a second process operation 147-2 is performed on the exposed portions of the metal silicide layer 149P so as to thereby effectively increase the amount of atomic silicon in the metal silicide layer 149P and thereby convert it into a metal silicide layer 149N that has an atomic silicon content tailored for the NMOS device 104N. In one illustrative embodiment, the process operations 147-1 and 147-2 are designed such that the metal silicide layer 149N may be formed with about 40-95% atomic silicon when all processing is completed. The process operation 147-2 may be any of the process operations 147 described above.

Figure 6E:
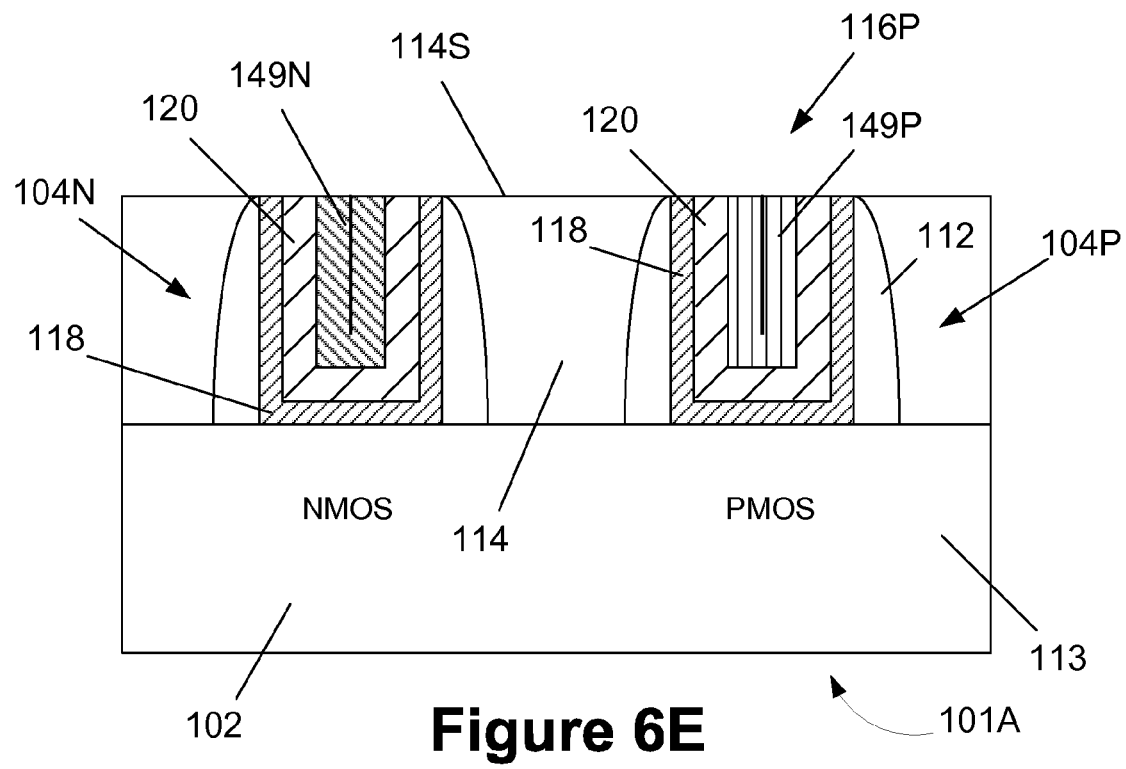

FIG. 6E depicts the product 101A after several process operations were performed. First, the patterned mask layer 151 was removed. Then, one or more planarization processes were performed to remove the portions of the metal silicide layers 149N, 149P, the first metal layer 120 and the high-k gate insulation layer 118 that are positioned above the surface 114S of the layer of insulating material 114 and outside of the gate cavities 116N, 116P. The structure depicted in FIG. 6E may be achieved by performing one or more CMP and/or etching processes in any of a variety of different processing sequences.

Figure 6F:
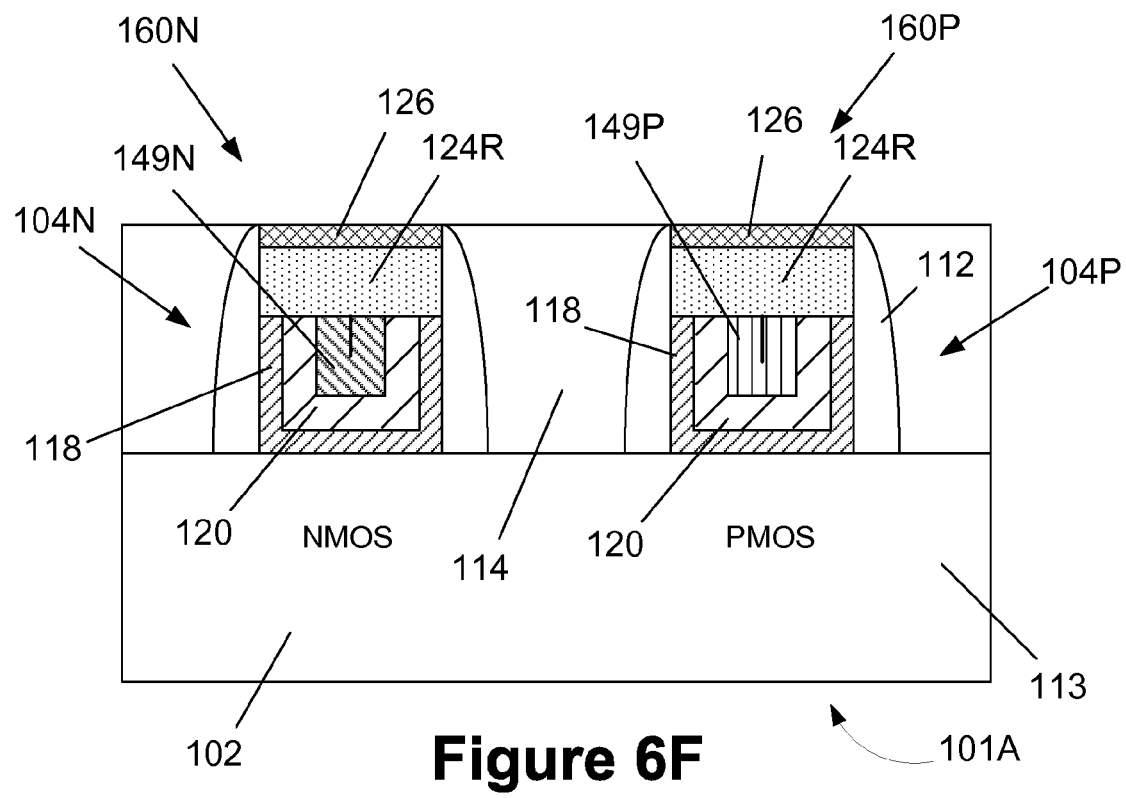

FIG. 6F depicts the product 101A after the processing sequence described above in connection with FIGS. 2G-2I was performed to result in the formation of the second metal layer 124R and the gate cap layers 126 as depicted in the drawing. At this point in the process flow, the final gate structures 160N, 160P for the transistors 104N, 104P, respectively, have been formed. At the point of fabrication depicted in FIG. 6F, the integrated circuit product 101A may be completed by performing several traditional manufacturing processes, e.g., the formation of contacts to the source/drain regions of the device, the formation of various metallization layers for the product, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
    an NMOS transistor, said NMOS transistor comprising:
        an NMOS gate structure, comprising:
            an NMOS gate insulation layer comprised of a high-k gate insulation material;
            a first NMOS metal layer comprised of a first metal positioned on said NMOS gate insulation layer; and
            an NMOS metal silicide material positioned above said first NMOS metal layer, said NMOS metal silicide material comprising a first amount of atomic silicon;
        a first dielectric gate cap layer positioned above said NMOS gate structure; and
        a first sidewall spacer positioned adjacent to and laterally confining sidewalls of said NMOS gate structure and sidewalls of said first dielectric gate cap layer; and
    a PMOS transistor, said PMOS transistor comprising:
        a PMOS gate structure, comprising:
            a PMOS gate insulation layer comprised of said high-k gate insulation material;
            a first PMOS metal layer comprised of said first metal positioned on said PMOS gate insulation layer; and
            a PMOS metal silicide material positioned above said first PMOS metal layer, said PMOS metal silicide material comprising a second amount of atomic silicon, wherein said first and second amounts of atomic silicon are different;
        a second dielectric gate cap layer positioned above said PMOS gate structure; and
        a second sidewall spacer positioned adjacent to and laterally confining sidewalls of said PMOS gate structure and sidewalls of said second dielectric gate cap layer.

2. The device of claim 1, wherein said first amount of atomic silicon is greater than said second amount of atomic silicon.

3. The device of claim 1, wherein said NMOS metal silicide material comprises 50-95% atomic silicon.

4. The device of claim 1, wherein said PMOS metal silicide material comprises 2-40% atomic silicon.

5. The device of claim 1, wherein said NMOS metal silicide material and said PMOS metal silicide material are one of tungsten silicide, hafnium silicide, tantalum silicide, titanium silicide, nickel silicide, nickel-platinum silicide, a silicide of a refractory metal, and a silicide of a transition metal.

6. The device of claim 1, wherein said NMOS metal silicide material and said PMOS metal silicide material are comprised of the same metal silicide material.

7. The device of claim 1, wherein said NMOS metal silicide material and said PMOS metal silicide material are comprised of different metal silicide materials.

8. The device of claim 1, wherein the difference between said first and second amounts of atomic silicon is at least 10 atomic percent.

9. The device of claim 1, wherein said NMOS gate structure further comprises a second metal layer positioned above said NMOS gate insulation layer, said first NMOS metal layer, and said NMOS metal silicide material.

10. The device of claim 9, wherein said NMOS gate insulation layer comprises a horizontal bottom portion positioned above an active region of said NMOS transistor and vertical sidewall portions positioned adjacent to inside sidewalls of said first sidewall spacer, and wherein said vertical sidewall portions of said NMOS gate insulation layer are positioned below said second metal layer and laterally confine said first NMOS metal layer and said NMOS metal silicide material.

11. The device of claim 10, wherein said first NMOS metal layer comprises a horizontal bottom portion positioned above said horizontal bottom portion of said NMOS gate insulation layer and vertical sidewall portions positioned adjacent said vertical sidewall portions of said NMOS gate insulation layer, and wherein said vertical sidewall portions of said first NMOS metal layer are positioned below said second metal layer and laterally confine said NMOS metal silicide material.

12. The device of claim 1, wherein said PMOS gate structure further comprises a second metal layer positioned above said PMOS gate insulation layer, said first PMOS metal layer, and said PMOS metal silicide material.

13. The device of claim 12, wherein said PMOS gate insulation layer comprises a horizontal portion positioned above an active region of said PMOS transistor and vertical sidewall portions positioned adjacent to inside sidewalls of said second sidewall spacer, and wherein said vertical sidewall portions of said PMOS gate insulation layer are positioned below said second metal layer and laterally confine said first PMOS metal layer and said PMOS metal silicide material.

14. The device of claim 13, wherein said first PMOS metal layer comprises a horizontal bottom portion positioned above said horizontal bottom portion of said PMOS gate insulation layer and vertical sidewall portions positioned adjacent said vertical sidewall portions of said PMOS gate insulation layer, and wherein said vertical sidewall portions of said first PMOS metal layer are positioned below said second metal layer and laterally confine said PMOS metal silicide material.

15. An integrated circuit product, comprising:
an NMOS transistor having an NMOS gate structure comprised of:
an NMOS gate insulation layer comprised of a high-k gate insulation material;
a first NMOS metal layer comprised of a first metal material positioned on said NMOS gate insulation layer;
an NMOS metal silicide material positioned above said first NMOS metal layer, said NMOS metal silicide material comprising 50-95% atomic silicon; and
a layer of a second metal material positioned above and in contact with each of said NMOS gate insulation layer, said first NMOS metal layer, and said NMOS metal silicide layer; and
a PMOS transistor having a PMOS gate structure comprised of:
a PMOS gate insulation layer comprised of said high-k gate insulation material;
a first PMOS metal layer comprised of said first metal material positioned on said PMOS gate insulation layer;
a PMOS metal silicide material positioned above said first PMOS metal layer, said PMOS metal silicide material comprising 2-40% atomic silicon; and
a layer of said second metal material positioned above and in contact with each of said PMOS gate insulation layer, said first PMOS metal layer, and said PMOS metal silicide layer.

16. The device of claim 15, wherein said NMOS metal silicide material and said PMOS metal silicide material are comprised of the same metal silicide material.

17. The device of claim 15, wherein said NMOS metal silicide material and said PMOS metal silicide material are comprised of different metal silicide materials.

18. The device of claim 15, wherein said NMOS transistor further comprises a first dielectric gate cap layer positioned above said NMOS gate structure and a first sidewall spacer positioned adjacent to and laterally confining sidewalls of said NMOS gate structure and sidewalls of said first dielectric gate cap layer, and wherein said PMOS transistor further comprises a second dielectric gate cap layer positioned above said PMOS gate structure and a second sidewall spacer positioned adjacent to and laterally confining sidewalls of said PMOS gate structure and sidewalls of said second dielectric gate cap layer.

19. An integrated circuit product, comprising:
an NMOS transistor, said NMOS transistor comprising:
an NMOS gate structure, comprising:
an NMOS gate insulation layer comprised of a high-k gate insulation material, wherein said NMOS gate insulation layer comprises a first horizontal bottom portion positioned above an active region of said NMOS transistor and first vertical sidewall portions that define a portion of a sidewall of said NMOS gate structure;
a first NMOS metal layer comprised of a first metal material positioned on said NMOS gate insulation layer; and
an NMOS metal silicide material positioned above said first NMOS metal layer, said NMOS metal silicide material comprising a first amount of atomic silicon, wherein said first vertical sidewall portions of said NMOS gate insulation layer laterally confine said first NMOS metal layer and said NMOS metal silicide material;
a first dielectric gate cap layer positioned above said NMOS gate structure; and
a first sidewall spacer positioned adjacent to and laterally confining sidewalls of said NMOS gate structure and sidewalls of said first dielectric gate cap layer; and
a PMOS transistor, said PMOS transistor comprising:
a PMOS gate structure, comprising:
a PMOS gate insulation layer comprised of said high-k gate insulation material, wherein said PMOS gate insulation layer comprises a second horizontal bottom portion positioned above an active region of said PMOS transistor and second vertical sidewall portions that define a portion of a sidewall of said PMOS gate structure;
a first PMOS metal layer comprised of said first metal material positioned on said PMOS gate insulation layer; and
a PMOS metal silicide material positioned above said first PMOS metal layer, said PMOS metal silicide material comprising a second amount of atomic silicon that is different from said first amount of atomic silicon, wherein said second vertical sidewall portions of said PMOS gate insulation layer laterally confine said first PMOS metal layer and said PMOS metal silicide material;
a second dielectric gate cap layer positioned above said PMOS gate structure; and
a second sidewall spacer positioned adjacent to and laterally confining sidewalls of said PMOS gate structure and sidewalls of said second dielectric gate cap layer.

20. The device of claim 19, wherein said NMOS gate structure further comprises a layer of a second metal material positioned above and in contact with each of said NMOS gate insulation layer, said first NMOS metal layer, and said NMOS metal silicide material, and wherein said PMOS gate structure further comprises a layer of said second metal material positioned above and in contact with each of said PMOS gate insulation layer, said first PMOS metal layer, and said PMOS metal silicide material.

* * * * *